(12) United States Patent
Hayashi et al.

(10) Patent No.: US 8,802,971 B2
(45) Date of Patent: Aug. 12, 2014

(54) PHOTOELECTRIC CONVERSION ELEMENT

(71) Applicant: JX Nippon Oil & Energy Corporation, Chiyoda-ku (JP)

(72) Inventors: Shinya Hayashi, Chiyoda-ku (JP); Masanao Goto, Chiyoda-ku (JP); Keisuke Nakayama, Chiyoda-ku (JP); Tsuyoshi Asano, Chiyoda-ku (JP); Tai Ohuchi, Chiyoda-ku (JP)

(73) Assignee: JX Nippon Oil & Energy Corporation, Chiyoda-Ku, Tokyo (JP)

( * ) Notice: Subject to any disclaimer, the term of this patent is extended or adjusted under 35 U.S.C. 154(b) by 0 days.

(21) Appl. No.: 13/725,388

(22) Filed: Dec. 21, 2012

(65) Prior Publication Data

US 2013/0174902 A1    Jul. 11, 2013

Related U.S. Application Data

(63) Continuation of application No. PCT/JP2011/003572, filed on Jun. 22, 2011.

(30) Foreign Application Priority Data

Jun. 23, 2010 (JP) ................... 2010-142888
May 20, 2011 (JP) ................... 2011-113866
May 23, 2011 (JP) ................... 2011-114313

(51) Int. Cl.
*H01L 31/0236* (2006.01)
(52) U.S. Cl.
USPC .................. 136/256; 136/252; 136/258
(58) Field of Classification Search
USPC ........................... 136/252, 256, 258
See application file for complete search history.

(56) References Cited

U.S. PATENT DOCUMENTS

| | | | |
|---|---|---|---|
| 4,268,347 A * | 5/1981 | Stephens | 216/87 |
| 6,350,945 B1 | 2/2002 | Mizuno | |
| 2007/0235072 A1 | 10/2007 | Bermel et al. | |
| 2009/0235986 A1* | 9/2009 | Hotz et al. | 136/260 |
| 2010/0187987 A1* | 7/2010 | Nakamura | 313/504 |
| 2010/0218822 A1 | 9/2010 | Yamasaki et al. | |

FOREIGN PATENT DOCUMENTS

| | | |
|---|---|---|
| JP | 61-288473 A | 12/1986 |
| JP | 04-133360 A | 5/1992 |
| JP | 2000-294818 A | 10/2000 |
| JP | 2001-127313 A | 5/2001 |

(Continued)

OTHER PUBLICATIONS

International Search Report (PCT/ISA/210) issued on Sep. 27, 2011, by the Japanese Patent Office as the International Searching Authority for International Application No. PCT/JP2011/003572.

(Continued)

*Primary Examiner* — Susan D Leong
(74) *Attorney, Agent, or Firm* — Buchanan Ingersoll & Rooney PC

(57) ABSTRACT

A photoelectric conversion element comprising: a photoelectric conversion layer; and a plurality of metal nanoparticles arranged in the form of a two-dimensional array on the photoelectric conversion layer on its principal face side that is opposite to its light receiving face, wherein the plurality of metal nanoparticles are arranged with a particle density that is equal to or greater than $5.0 \times 10^8/cm^2$ and is equal to or smaller than $3.0 \times 10^9/cm^2$.

6 Claims, 6 Drawing Sheets

(56) References Cited

FOREIGN PATENT DOCUMENTS

| JP | 2009-533875 A | 9/2009 |
|---|---|---|
| JP | 2009-246025 A | 10/2009 |
| JP | 2010-087477 A | 4/2010 |
| WO | WO 2007/121082 A2 | 10/2007 |

OTHER PUBLICATIONS

International Preliminary Report on Patentability (PCT/IB/373) and Written Opinion (PCT/ISA237) for International Application No. PCT/JP2011/003572.

* cited by examiner

PHOTOELECTRIC CONVERSION ELEMENT

BACKGROUND OF THE INVENTION

1. Field of the Invention

The present invention relates to a photoelectric conversion element configured to convert light energy into electric energy by means of photoelectric conversion.

2. Description of the Related Art

In order to provide improved resource saving and reduced costs, there is a demand for photoelectric conversion elements such as solar cells having a photoelectric conversion layer with a further reduced thickness. In a case of only reducing the thickness of the photoelectric conversion layer, this leads to a problem of reduced light absorption. In order to solve such a problem, as an indispensable technique, there is a demand for a technique for improving the light absorption of the photoelectric conversion layer.

As such a technique, there is a technique in which a texture structure is formed on the front face and/or the back face of the photoelectric conversion layer, configured to scatter input light and reflected light on the front face and/or the back face of the photoelectric conversion layer, thereby increasing the light path length in the photoelectric conversion layer. Also, there is a known technique for providing a periodic microstructure to such a photoelectric conversion element. In this case, by setting a condition such that the light passing through the photoelectric conversion layer is diffracted due to such a periodic microstructure, and such that total reflection of the reflected light occurs in the photoelectric conversion layer, such an arrangement allows the light to be confined in the photoelectric conversion layer, thereby providing improved photoelectric conversion efficiency.

PATENT DOCUMENTS

[Patent Document 1]
  Japanese Patent Application Laid Open No. S61-288473
[Patent Document 2]
  Japanese Patent Application Laid Open No. H04-133360
[Patent Document 3]
  Japanese Patent Application Laid Open No. 2000-294818
[Patent Document 4]
  PCT Japanese Translation Patent Publication No. 2009-533875
[Patent Document 5]
  Japanese Patent Application Laid Open No. 2001-127313

However, with such a conventional configuration in which such a texture structure is formed on the front face and/or the back face of the photoelectric conversion layer, such an arrangement has a problem in that a relatively large amount of light is not reflected toward the photoelectric conversion layer, and leaks to the outside of the photoelectric conversion element. Examples of conceivable methods for reducing such leakage of light to the outside includes a method in which such a texture structure is arranged in a periodic manner. However, such a texture structure arranged in a periodic manner requires a high cost, leading to difficulty in providing such a photoelectric conversion element with a low cost. Furthermore, in a case in which a periodic microstructure is provided to such a photoelectric conversion element, such an arrangement also requires a high cost, leading to difficulty in providing such a photoelectric conversion element with a low cost.

SUMMARY OF THE INVENTION

The present invention has been made in order to solve such a problem. Accordingly, it is a general purpose of the present invention to provide a technique for raising the light absorption efficiency while suppressing an increase in the manufacturing cost, thereby providing improved photoelectric conversion efficiency.

An embodiment of the present invention relates to a photoelectric conversion element. The photoelectric conversion element comprises: a photoelectric conversion layer; and multiple metal nanoparticles arranged in the form of a two-dimensional array on the photoelectric conversion layer on its principal face side that is opposite to its light receiving face. With such an arrangement, the multiple metal nanoparticles are arranged with a particle density that is equal to or greater than $5.0 \times 10^8/cm^2$ and is equal to or smaller than $3.0 \times 10^9/cm^2$.

With such a photoelectric conversion element according to the embodiment, incident light that could not be absorbed by the photoelectric conversion element is scattered and reflected by the multiple metal nanoparticles arranged on the photoelectric conversion element on its principal face side that is opposite to its light receiving face. This provides an increased light path length for the incident light in the photoelectric conversion layer, thereby allowing the photoelectric conversion element to absorb the incident light with high efficiency.

With the photoelectric conversion element according to the aforementioned embodiment, the multiple metal nanoparticles may be formed of Au, Ag, Al, or Cu, or otherwise an alloy material containing such metal materials. Also, the photoelectric conversion element may further include a dielectric layer having a refractive index of 1.3 or more, and configured so as to coat the surface of each metal nanoparticle. Also, the photoelectric conversion element may further include a transparent thin film arranged between the metal nanoparticles and the photoelectric conversion layer. Also, the transparent thin film may be configured to have an oxygen content of 5 atm % or more.

Another embodiment of the present invention also relates to a photoelectric conversion element. The photoelectric conversion element comprises: a photoelectric conversion layer; and multiple metal nanoparticles arranged in a two-dimensional manner on the photoelectric conversion layer on its principal face side. With such an arrangement, the multiple metal nanoparticles are configured such that the number of metal nanoparticles having a degree of circularity that is greater than 0 and that is equal to or smaller than 0.3, as viewed along a direction that is approximately orthogonal to the principal face of the photoelectric conversion layer, is equal to or greater than 0.3% of the total number of the multiple metal nanoparticles.

Yet Another embodiment of the present invention also relates to a photoelectric conversion element. The photoelectric conversion element comprises: a photoelectric conversion layer; and multiple metal nanoparticles arranged in a two-dimensional manner on the photoelectric conversion layer on its principal face side. With such an arrangement, the multiple metal nanoparticles are configured such that the number of metal nanoparticles having a degree of circularity that is greater than 0 and that is equal to or smaller than 0.4, as viewed along a direction that is approximately orthogonal to the principal face of the photoelectric conversion layer, is equal to or greater than 1% of the total number of the multiple metal nanoparticles.

Yet Another embodiment of the present invention also relates to a photoelectric conversion element. The photoelectric conversion element comprises: a photoelectric conversion layer; and multiple metal nanoparticles arranged in a two-dimensional manner on the photoelectric conversion layer on its principal face side. With such an arrangement, the multiple metal nanoparticles are configured such that the number of metal nanoparticles having a degree of circularity that is greater than 0 and that is equal to or smaller than 0.5, as viewed along a direction that is approximately orthogonal to the principal face of the photoelectric conversion layer, is equal to or greater than 3% of the total number of the multiple metal nanoparticles.

Yet Another embodiment of the present invention also relates to a photoelectric conversion element. The photoelectric conversion element comprises: a photoelectric conversion layer; and multiple metal nanoparticles arranged in a two-dimensional manner on the photoelectric conversion layer on its principal face side. With such an arrangement, the multiple metal nanoparticles are configured such that the number of metal nanoparticles having a degree of circularity that is greater than 0 and that is equal to or smaller than 0.6, as viewed along a direction that is approximately orthogonal to the principal face of the photoelectric conversion layer, is equal to or greater than 6% of the total number of the multiple metal nanoparticles.

Yet Another embodiment of the present invention also relates to a photoelectric conversion element. The photoelectric conversion element comprises: a photoelectric conversion layer; and multiple metal nanoparticles arranged in a two-dimensional manner on the photoelectric conversion layer on its principal face side. With such an arrangement, the multiple metal nanoparticles are configured such that the number of metal nanoparticles having a degree of circularity that is equal to or greater than 0.3 and that is equal to or smaller than 0.4, as viewed along a direction that is approximately orthogonal to the principal face of the photoelectric conversion layer, is equal to or greater than 1% of the total number of the multiple metal nanoparticles.

Yet Another embodiment of the present invention also relates to a photoelectric conversion element. The photoelectric conversion element comprises: a photoelectric conversion layer; and multiple metal nanoparticles arranged in a two-dimensional manner on the photoelectric conversion layer on its principal face side. With such an arrangement, the multiple metal nanoparticles are configured such that the number of metal nanoparticles having a degree of circularity that is equal to or greater than 0.4 and that is equal to or smaller than 0.5, as viewed along a direction that is approximately orthogonal to the principal face of the photoelectric conversion layer, is equal to or greater than 3% of the total number of the multiple metal nanoparticles.

Yet Another embodiment of the present invention also relates to a photoelectric conversion element. The photoelectric conversion element comprises: a photoelectric conversion layer; and multiple metal nanoparticles arranged in a two-dimensional manner on the photoelectric conversion layer on its principal face side. With such an arrangement, the multiple metal nanoparticles are configured such that the number of metal nanoparticles having a degree of circularity that is equal to or greater than 0.5 and that is equal to or smaller than 0.6, as viewed along a direction that is approximately orthogonal to the principal face of the photoelectric conversion layer, is equal to or greater than 4% of the total number of the multiple metal nanoparticles.

Yet Another embodiment of the present invention also relates to a photoelectric conversion element. The photoelectric conversion element comprises: a photoelectric conversion layer; and multiple metal nanoparticles arranged in a two-dimensional manner on the photoelectric conversion layer on its principal face side. With such an arrangement, as viewed along a direction that is approximately orthogonal to the principal face of the photoelectric conversion layer, the multiple metal nanoparticles are configured to have an average degree of circularity that is equal to or smaller than 0.8.

Yet Another embodiment of the present invention also relates to a photoelectric conversion element. The photoelectric conversion element comprises: a photoelectric conversion layer; and multiple metal nanoparticles arranged in a two-dimensional manner on the photoelectric conversion layer on its principal face side. With such an arrangement, as viewed along a direction that is approximately orthogonal to the principal face of the photoelectric conversion layer, the multiple metal nanoparticles are configured to have a 10% degree of circularity that is equal to or smaller than 0.6.

With the photoelectric conversion element according to any one of the aforementioned embodiments, such an arrangement provides an increase in the light absorption efficiency of the photoelectric conversion element while suppressing an increase in manufacturing costs, thereby providing improved photoelectric conversion efficiency.

With the photoelectric conversion element according to any one of the aforementioned embodiments, the multiple metal nanoparticles may be arranged on the photoelectric conversion layer on its principal face side that is opposite to its light receiving face. Also, the multiple metal nanoparticles may be formed of Au, Ag, Al, or Cu, or otherwise an alloy material containing such metal materials. Also, the photoelectric conversion element may further include a transparent thin film arranged between the multiple metal nanoparticles and the photoelectric conversion layer. Also, the photoelectric conversion layer may be configured as a monocrystalline silicon layer having a pn junction or otherwise a polysilicon layer having a pn junction. Also, the multiple metal nanoparticles may be formed by heating a metal thin film.

Yet Another embodiment of the present invention also relates to a photoelectric conversion element. The photoelectric conversion element comprises: a photoelectric conversion layer; and multiple metal nanoparticles arranged in a two-dimensional manner on the photoelectric conversion layer on its principal face side. With such an arrangement, as viewed along a direction that is approximately orthogonal to the principal face of the photoelectric conversion layer, the multiple metal nanoparticles are configured to have a 1% particle area ratio that is equal to or smaller than 0.1.

Yet Another embodiment of the present invention also relates to a photoelectric conversion element. The photoelectric conversion element comprises: a photoelectric conversion layer; and multiple metal nanoparticles arranged in a two-dimensional manner on the photoelectric conversion layer on its principal face side. With such an arrangement, as viewed along a direction that is approximately orthogonal to the principal face of the photoelectric conversion layer, the multiple metal nanoparticles are configured to have a 5% particle area ratio that is equal to or smaller than 0.2.

Yet Another embodiment of the present invention also relates to a photoelectric conversion element. The photoelectric conversion element comprises: a photoelectric conversion layer; and multiple metal nanoparticles arranged in a two-dimensional manner on the photoelectric conversion layer on its principal face side. With such an arrangement, as viewed along a direction that is approximately orthogonal to the principal face of the photoelectric conversion layer, the multiple metal nanoparticles are configured to have a 10% particle area ratio that is equal to or smaller than 0.3.

With the photoelectric conversion element according to any one of the aforementioned embodiments, such an arrangement provides an increase in the light absorption efficiency of the photoelectric conversion element while suppressing an increase in manufacturing costs, thereby providing improved photoelectric conversion efficiency.

With the photoelectric conversion element according to any one of the aforementioned embodiments, the multiple metal nanoparticles may be arranged on the photoelectric conversion layer on its principal face side that is opposite to its light receiving face. Also, the multiple metal nanoparticles may be formed of Au, Ag, Al, or Cu, or otherwise an alloy material containing such metal materials. Also, the photoelectric conversion element may further include a transparent thin film arranged between the multiple metal nanoparticles and the photoelectric conversion layer. Also, the photoelectric conversion layer may be configured as a monocrystalline silicon layer having a pn junction or otherwise a polysilicon layer having a pn junction. Also, the multiple metal nanoparticles may be formed by heating a metal thin film.

It should be noted that various modification may be made by making a combination of the aforementioned arrangements as appropriate, which are also encompassed within the scope of the present invention to be protected by the present patent application.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Description will be made below regarding embodiments of the present invention with reference to drawings. It should be noted that the same components are denoted by the same reference symbols, and redundant description will be omitted as appropriate.

[Embodiment 1]

Figure 1A:
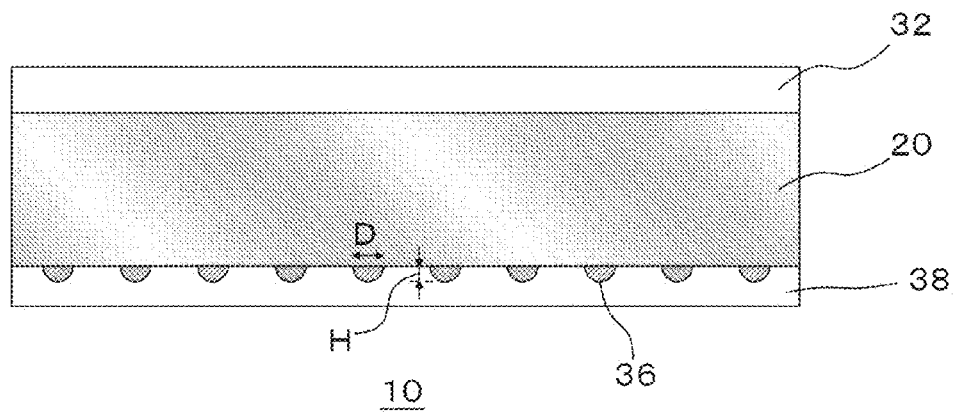
FIG. 1A is a schematic cross-sectional diagram showing a structure of a photoelectric conversion element according to an embodiment 1.
Figure 1B:
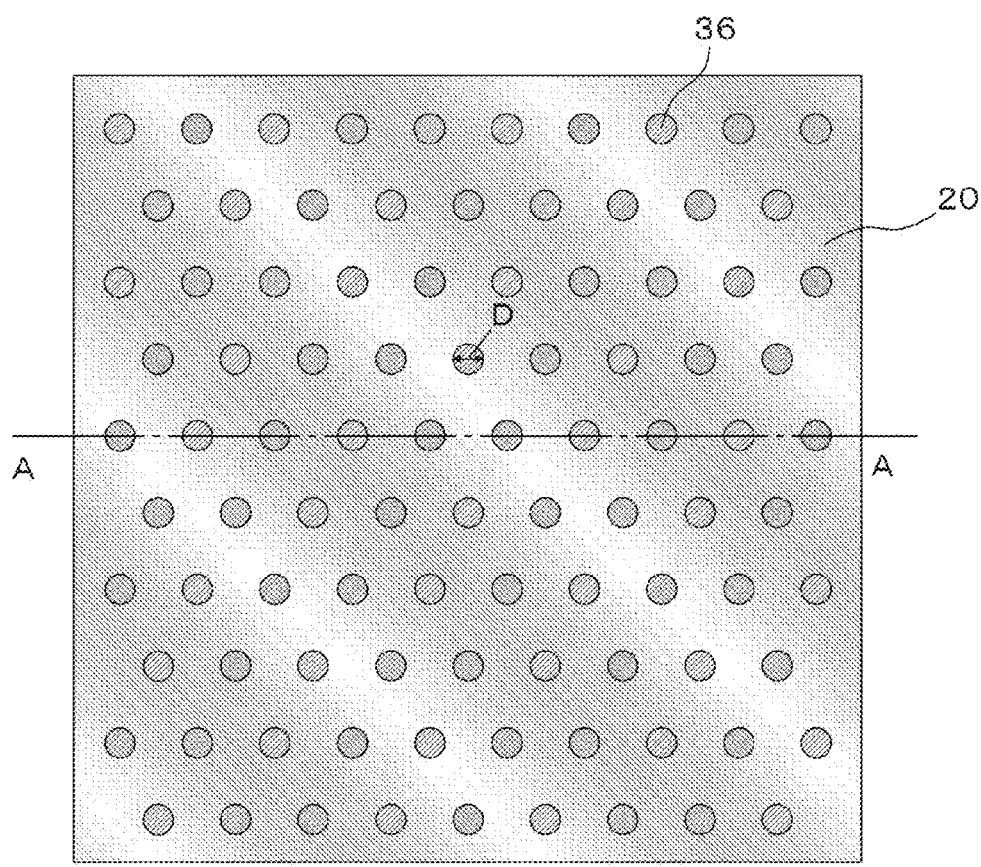
FIG. 1B is a plan view showing the layout of metal nanoparticles when a semiconductor substrate is shown from its back face side.

FIG. 1A is a schematic cross-sectional view showing a structure of a photoelectric conversion element according to an embodiment 1. FIG. 1B is a plan view showing a metal nanoparticle array included in the photoelectric conversion element as viewed from the side that is opposite to the light receiving face.

FIG. 1A corresponds to a cross-sectional view taken along line A-A in FIG. 1B. In FIG. 1B, a dielectric layer 38 is not shown.

As shown in FIG. 1A, a photoelectric conversion element 10 includes a photoelectric conversion layer 20, an antireflection film 32, multiple metal nanoparticles 36, and a dielectric layer 38. With the present embodiment, the photoelectric conversion element 10 is configured as a solar cell.

The photoelectric conversion layer 20 has a pn junction obtained by combining a P-type semiconductor and an N-type semiconductor, which allows solar light energy to be converted into electric energy by means of the photovoltaic effect of the pn junction. By providing respective electrodes (not shown) to the n-type semiconductor and the p-type semiconductor, such an arrangement allows the photoelectric conversion element 10 to output a DC current to an external circuit. For example, the photoelectric conversion layer 20 is configured as a monocrystalline silicon substrate including a pn junction, known as a solar cell, formed of an IV family semiconductor substrate.

As shown in FIGS. 1A and 1B, the antireflection film 32 is formed on a first principal face of the photoelectric conversion layer 20 on the light receiving face side of the photoelectric conversion element 10. The structure and the material of the antireflection film 32 are not restricted in particular as long as the antireflection film 32 is transparent to the wavelength range of the light to be received by the photoelectric conversion element 10, and has a function for preventing reflection of the light received by the photoelectric conversion element 10. Examples of the materials of the antireflection film 32 include $SiO_2$, $SiN_x$, $TiO_2$, ITO, and so forth.

The multiple metal nanoparticles 36 are arranged in the form of a two-dimensional array on a second principal face of the photoelectric conversion layer 20 on the side that is opposite to the light receiving face of the photoelectric conversion element 10. In other words, the multiple metal nanoparticles 36 are dotted in the form of a two-dimensional array on the second principal face of the photoelectric conversion layer 20.

The material of each metal nanoparticle 36 is not restricted in particular as long as it is formed of a metal material. However, the metal nanoparticles 36 are preferably formed of a material having a resonance wavelength in the Frohlich mode (see Bohren and Huffman, Absorption and Scattering of Light by Small Particles, Wiley, 1983) which is close to the wavelength of the light to be prevented from being reflected. Examples of such materials include Au, Ag, Al, and Cu, and alloys including such metal materials.

In the plan view showing the photoelectric conversion layer 20, the particle density of the metal nanoparticles 36 arranged per unit area is preferably set to a range between $5.0 \times 10^8/cm^2$ and $3.0 \times 10^9/cm^2$, is more preferably set to a range between $7.0 \times 10^8/cm^2$ and $2.5 \times 10^9/cm^2$, and is even more preferably set to a range between $1.0 \times 10^9/cm^2$ and $2.0 \times 10^9/cm^2$.

The form of each metal nanoparticle 36 is not restricted in particular. Examples of the form of each metal nanoparticle 36 include a spherical form, a semi-spherical form, a cylindrical form, a prismatic form, a rod-shaped form, a disc-shaped form, and so forth. In the plan view of the photoelectric conversion layer 20, each metal nanoparticle 36 is configured to have a diameter D ranging between 80 and 400 nm, for example. With the second principal face of the photoelectric conversion layer 20 as the base level, each metal nanoparticle 36 is configured to have a height H ranging between 5 and 500 nm, for example.

The dielectric layer 38 is arranged on the second principal face side of the photoelectric conversion layer 20 so as to cover at least the surface of each metal nanoparticle 36. The dielectric layer 38 is preferably configured to have a refractive index of 1.3 or more. Furthermore, as one of the characteristics of the dielectric layer 38, the dielectric layer 38 is transparent to the light to be received by the photoelectric conversion element 10. That is to say, the dielectric layer 38 has a bandgap that is greater than that of the photoelectric conversion layer 20. Furthermore, in a case in which an electrode is formed on the dielectric layer 38, from the viewpoint of improving current collecting efficiency, the dielectric layer 38 is preferably configured to have electrical conductivity. Examples of materials of such a dielectric layer 38 include: calcium fluoride, magnesium fluoride, barium fluoride, lithium fluoride, silicon carbide, sapphire, alumina, quartz, fluorine resin, $SnO_2$, FTO (fluorine-doped tin oxide), ITO, ZnO, $SiO_2$, $TiO_2$, $ZrO_2$, $Mn_3O_4$, $Y_2O_3$, $WO_3$, $Nb_2O_5$, $La_2O_3$, $Ga_2O_3$, $Ag_2O$, CuO, a-Si:H, μc-Si:H, $SiO_x$:H, SiC, $SiN_x$, $AlO_x$:H, polyethylene terephthalate, polycarbonate, polymethylmethacrylate, polyethylene, polypropylene, ethylene vinyl acetate co-polymer, polystyrene, polyimide, polyamide, polybutylene terephthalate, polyethylene naphthalate, polysulfone, polyethersulfone, polyether ketone, polyvinyl alcohol, polyvinyl chloride, polyvinylidene chloride, triacetyl cellulose, polyurethane, cycloolefin polymer, and so forth. The thickness of the dielectric layer 38 is not restricted in particular. The dielectric layer 38 is configured to have a thickness of 5 to 2000 nm, for example.

With the photoelectric conversion element 10 according to the embodiment 1 as described above, the incident light which could not be absorbed by the photoelectric conversion element 10 is scattered and reflected by the multiple metal nanoparticles 36 arranged on the second principal face side of the photoelectric conversion element 10. This increases the light path length of the incident light in the photoelectric conversion layer 20, thereby allowing the incident light to be absorbed with high efficiency.

More specifically, the light scattering due to a single such metal nanoparticle 36 has no directionality. Thus, the light that collides with a single such metal nanoparticle 36 is reflected randomly. However, by adjusting the particle density of the multiple metal nanoparticles 36, with the mutual interaction of the multiple metal nanoparticles 36, such an arrangement allows the direction of the reflected light from the metal nanoparticles 36 to be controlled. In particular, by arranging the multiple metal nanoparticles 36 with a particle density in a range of $5.0 \times 10^8$ particles/$cm^2$ to $3.0 \times 10^9$ particles/$cm^2$, such an arrangement provides a large scattering angle of the reflected light from the metal nanoparticles 36, thereby increasing the light path length in the photoelectric conversion layer 20. As a result, such an arrangement allows the photoelectric conversion layer 20 to absorb the received light with high efficiency, thereby providing the photoelectric conversion element 10 with high photoelectric conversion efficiency.

Furthermore, with the photoelectric conversion element 10 according to the present embodiment, multiple metal nanoparticles 36 are coated with the dielectric layer 38. This prevents the metal nanoparticles 36 from being exposed to air or water, thereby providing the metal nanoparticles 36 with improved stability. Moreover, in a case in which the photoelectric conversion layer 20 is highly transparent to light on the long-wavelength side, by shifting the effective wavelength of the metal nanoparticles 36 to the long-wavelength side, such an arrangement provides improved scattering characteristics.

[Production Method for Photoelectric Conversion Element]

FIG. 2 is a cross-sectional process diagram showing a production method for the photoelectric conversion element according to the embodiment 1. Description will be made with reference to FIG. 2 regarding the method for producing the photoelectric conversion element according to the embodiment 1.

Figure 2A:
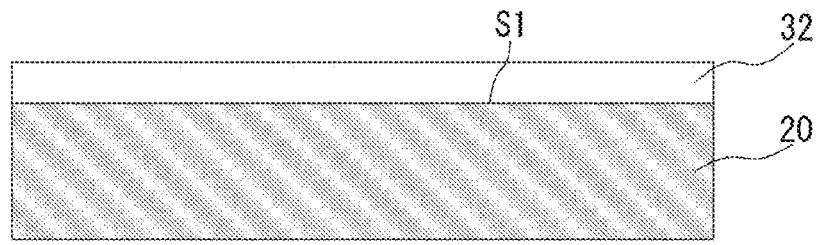
FIGS. 2A through 2D are cross-sectional process diagrams showing a production method for the photoelectric conversion element according to the embodiment 1.

First, as shown in FIG. 2A, the antireflection film 32 having a film thickness of 50 to 200 nm is laminated on the first principal face S1 of the photoelectric conversion layer 20 configured as a light receiving face. It should be noted that the photoelectric conversion layer 20 includes a p-type monocrystalline silicon substrate. The photoelectric conversion layer 20 has a pn junction formed beforehand using a known method such as a thermal diffusion method, an ion injection method, a vacuum film deposition method, or the like. The method for laminating the antireflection film 32 is not restricted in particular. Examples of such a method include a vacuum film deposition method in which a transparent material such as $SiN_x$, ITO, or the like, is deposited as a film on the photoelectric conversion layer 20 in a vacuum.

Figure 2B:
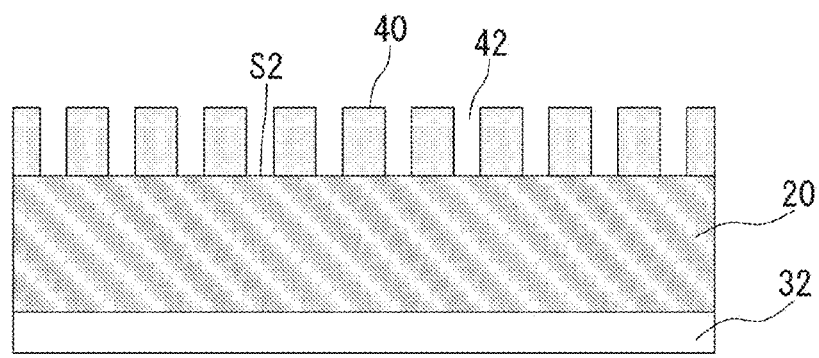

Next, as shown in FIG. 2B, a mask 40 is formed on the second principal face S2 of the photoelectric conversion layer 20 configured as a face that is opposite to the light receiving face. Multiple openings 42 are formed in the mask 40 so as to expose the area in which the metal nanoparticles are to be formed on the second principal face S2 of the photoelectric conversion layer 20. For example, the mask 40 may be formed by removing a part of an aluminum substrate that has not been anodized (a part other than a porous alumina film area) after the aluminum substrate is anodized, and by using a phosphoric acid solution to form through holes in the remaining porous alumina film. Also, the mask 40 may be formed as a patterned resist film having predetermined openings. By using such a resist film as the mask 40, such an arrangement allows the metal nanoparticles to be arranged in the form of a two-dimensional array in a regular pattern.

Figure 2C:
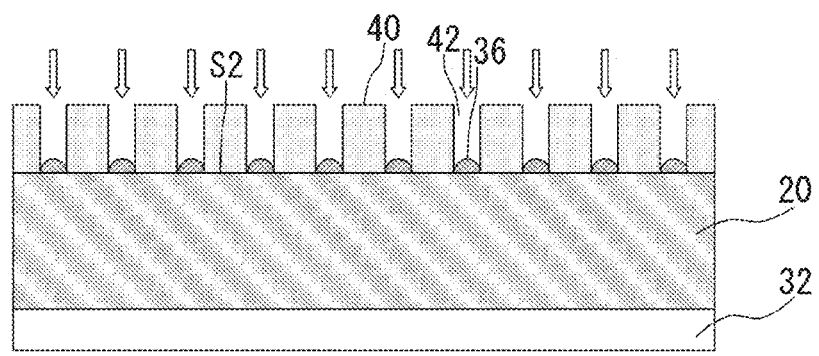

Next, as shown in FIG. 2C, a metal material such as Ag, Al, Au, Cu, or the like, or otherwise an alloy material containing such metal materials, is deposited on the second principal face S2 of the photoelectric conversion layer 20 through the mask 40 using a vacuum deposition method. The metal material passes through each opening 42 formed in the mask 40, and is selectively deposited as a metal particle on the second principal face S2 in each opening 42. Thus, a metal nanoparticle 36 is formed in each opening 42, thereby arranging the multiple metal nanoparticles 36 in the form of a two-dimensional array on the second principal face S2 of the photoelectric conversion layer 20. In the plan view of the photoelectric conversion layer 20, the size of each metal nanoparticle 36 is determined by the size of the corresponding opening 42 formed in the mask 40. In a case in which the mask 40 is formed using a porous alumina film, the size of each opening 42 is proportional to the voltage applied in the anode oxidation process for the aluminum substrate. For example, in a case in which a voltage of 120 V is applied to the aluminum substrate in an electrolytic solution containing 0.3 mol/L malonic acid, each opening 42 is formed with a diameter on the order of 150 nm, thereby providing each metal nanoparticle 36 with a size on the order of 150 nm. Furthermore, with the second principal face of the photoelectric conversion layer 20 as the base level, the height of each metal nanoparticle 36 can be controlled by adjusting the vacuum deposition time. In a case in which the vacuum deposition is performed in a short period of time, each metal nanoparticle 36 is formed in a semispherical form having a spherical surface facing the lower side (the side farther from the second principal face of the photoelectric conversion layer 20). In a case in which the vacuum deposition is performed in a sufficiently long period of time, each metal nanoparticle 36 is formed in a cylindrical form, a prismatic form, or a filler form.

Figure 2D:
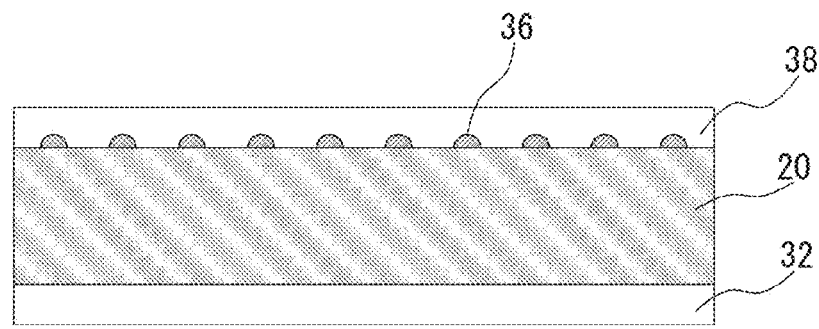

Next, as shown in FIG. 2D, after the mask 40 is removed, the dielectric layer 38 is laminated so as to cover the surface of each metal nanoparticle 36. The method for depositing the dielectric layer 38 is not restricted in particular. In the same way as with the method for producing the antireflection film 32, examples of the deposition method include a vacuum deposition method in which a dielectric material such as ITO, ZnO, or the like is deposited in a vacuum.

Such a process as described above allows the photoelectric conversion element 10 according to the embodiment 1 to be formed in a simple manner. This allows the photoelectric conversion element 10 to be manufactured at a reduced cost.

[Embodiment 2]

Figure 3:
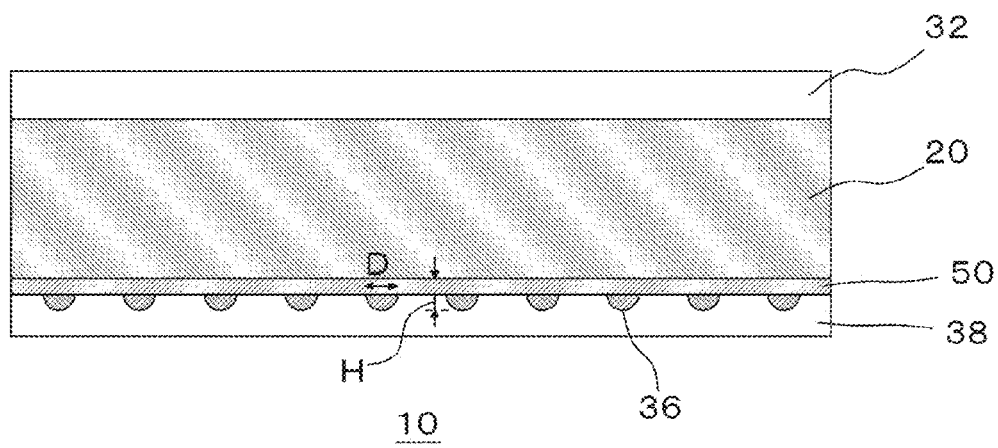
FIG. 3 is a schematic cross-sectional diagram showing a structure of a photoelectric conversion element according to an embodiment 2.

FIG. 3 is a schematic cross-sectional diagram showing a configuration of a photoelectric conversion element 10 according to an embodiment 2. With the photoelectric conversion element 10 according to the present embodiment, each metal nanoparticle 36 is not directly in contact with the second principal face of the photoelectric conversion layer 20. Instead, a transparent thin film 50 is formed between each metal nanoparticle 36 and the second principal face of the photoelectric conversion layer 20. The transparent thin film 50 is configured to be transparent to the light to be received by the photoelectric conversion element 10. That is to say, the transparent thin film 50 has a bandgap that is greater than that of the photoelectric conversion layer 20. Furthermore, in a case in which an electrode is formed on the second principal face side of the photoelectric conversion layer 20, from the viewpoint of improving the current collecting efficiency, the transparent thin film 50 is preferably configured to have electrical conductivity. Examples of materials of the transparent thin film 50 include: calcium fluoride, magnesium fluoride, barium fluoride, lithium fluoride, silicon carbide, sapphire, alumina, quartz, fluorine resin, $SnO_2$, FTO (fluorine-doped tin oxide), ITO, ZnO, $SiO_2$, $TiO_2$, $ZrO_2$, $Mn_3O_4$, $Y_2O_3$, $WO_3$, $Nb_2O_5$, $La_2O_3$, $Ga_2O_3$, $Ag_2O$, CuO, a-Si:H, μc-Si:H, $SiO_x$:H, SiC, $SiN_x$, $AlO_x$:H, polyethylene terephthalate, polycarbonate, polymethylmethacrylate, polyethylene, polypropylene, ethylene vinyl acetate co-polymer, polystyrene, polyimide, polyamide, polybutylene terephthalate, polyethylene naphthalate, polysulfone, polyethersulfone, polyether ketone, polyvinyl alcohol, polyvinyl chloride, polyvinylidene chloride, triacetyl cellulose, polyurethane, cycloolefin polymer, and so forth. The transparent thin film 50 is preferably configured to have a thickness of 5 to 200 nm. Furthermore, the transparent thin film 50 is preferably configured to have an oxygen concentration of 5 atm % or more. Moreover, with the refractive index of the transparent thin film 50 as $n_1$, and with the refractive index of the photoelectric conversion layer 20 as $n_2$, the relation expression $n_1 > 0.7 \cdot n_2$ is preferably satisfied.

In a case in which each metal nanoparticle 36 is in contact with the photoelectric conversion layer 20, such a configuration leads to carrier recombination in the metal-semiconductor interface between each metal nanoparticle 36 and the photoelectric conversion layer 20, or leads to contamination of the photoelectric conversion layer 20 due to migration of the metal atom clusters, of which the metal nanoparticles 36 are constituted, into the photoelectric conversion layer 20. In some cases, this leads to a problem of degradation of the photoelectric conversion efficiency of the photoelectric conversion element 10. In order to solve such a problem, as with the present embodiment, by providing such a transparent thin film 50 between the second principal face of the photoelectric conversion layer 20 and each metal nanoparticle 36, such an arrangement is capable of suppressing carrier recombination in the interface between each metal nanoparticle 36 and the photoelectric conversion layer 20. Furthermore, by configuring the transparent thin film 50 with an oxygen concentration of 5 atm % or more, such an arrangement is capable of effectively preventing the metal atom clusters of which the metal nanoparticles 36 are constituted from migrating to the photoelectric conversion layer 20.

Furthermore, with the refractive index of the transparent thin film 50 as $n_1$, and with the refractive index of the photoelectric conversion layer 20 as $n_2$, by satisfying the relation expression $n_1 > 0.7 \cdot n_2$, such an arrangement allows the scattering angle of the light reflected from the metal nanoparticles 36 to be further increased. Thus, such an arrangement provides a further increased light path length in the photoelectric conversion layer 20.

EXAMPLE 1-1

[Production of Photoelectric Conversion Layer]

An a-$SiO_x$:H layer having a thickness of 5 nm was laminated as an i-layer on one face of a p-type silicon wafer (having resistivity of 0.5 to 5 Ωcm) having a thickness of 100 μm. Furthermore, an n-type a-Si:H layer having a thickness of 7.5 nm was laminated on the i-layer, thereby forming a photoelectric conversion layer. The results of using a spectroscopic ellipsometer to measure the refractive index of the p-type silicon wafer indicated a refractive index of 3.9 at a wavelength of 600 nm.

[Production of Antireflection Film]

An ITO film having a thickness of 75 nm was formed as an antireflection film on the n-type a-Si:H layer.

[Production of Transparent Thin Film Layer]

A p-type microcrystalline $SiO_x$:H having a thickness of 30 nm was formed as a transparent thin film layer on the exposed face (back face) of the p-type silicon wafer. The results of using X-ray photoelectron spectroscopy to measure the oxygen content of the p-type microcrystalline $SiO_x$:H film indicated an oxygen content of 8 atm % oxygen. Furthermore, the results of using a spectroscopic ellipsometer to measure the refractive index of the p-type microcrystalline $SiO_x$:H indicated a refractive index of 3.4 at a wavelength of 600 nm.

[Production of Metal Nanoparticles]

After the surface of an aluminum substrate was anodized at 120 V in an aqueous solution containing 0.3 mol/L malonic acid, the aluminum substrate was removed except for the oxidized area (barrier layer). Next, a large number of holes formed in the barrier layer were etched using a 20-fold diluted phosphoric acid solution such that each hole became a through hole, thereby obtaining an alumina mask with an average hole diameter of 150 nm and with a hole density of $1.8 \times 10^9$ holes/$cm^2$. By depositing Ag on the microcrystalline $SiO_x$:H layer in a vacuum through the alumina mask thus formed, an array of metal nanoparticles having a height of 75 nm was formed. Using a scanning electron microscope (SEM), it was confirmed that the diameter of each metal nanoparticle and the particle density thus formed were the same as the diameter of the through hole and the hole density of the alumina mask used in the vacuum deposition.

[Production of Dielectric Layer]

As a dielectric layer covering the metal nanoparticles, a ZnO film having a thickness of 200 nm was formed. The results of using a spectroscopic ellipsometer to measure the refractive index of the ZnO film indicated a refractive index of 1.9 at a wavelength of 600 nm.

[Production of Electrode]

A thin-line electrode was formed using an Ag material on the ITO film configured as an antireflection film. Furthermore, a whole-surface electrode was formed using an Ag material on the ZnO film configured as a dielectric layer (on the principal face of the ZnO layer that is opposite to the photoelectric conversion layer).

By performing the aforementioned process, the photoelectric conversion element (solar cell) was produced according to the embodiment 1-1.

EXAMPLE 1-2

The solar cell according to Example 1-2 was produced according to the same procedure as that in Example 1-1, except for the production process for the metal nanoparticles.
[Production of Metal Nanoparticles]

After the surface of an aluminum substrate was anodized at 160 V in a mixed aqueous solution containing 0.2 mol/L malonic acid and 0.2 mol/L tartaric acid, the aluminum substrate was removed except for the oxidized area (barrier layer). Next, a large number of holes formed in the barrier layer were etched using a 20-fold diluted phosphoric acid solution such that each hole became a through hole, thereby obtaining an alumina mask with an average hole diameter of 200 nm and with a hole density of $1.0 \times 10^9$ holes/cm$^2$. By depositing Ag on the microcrystalline SiO$_x$:H layer in a vacuum through the alumina mask thus formed, an array of metal nanoparticles having a height of 100 nm was formed.

EXAMPLE 1-3

The solar cell according to Example 1-3 was produced according to the same procedure as that in Example 1-1, except for the production process for the metal nanoparticles.
[Production of Metal Nanoparticles]

After the surface of an aluminum substrate was anodized at 200 V in an aqueous solution containing 0.2 mol/L tartaric acid, the aluminum substrate was removed except for the oxidized area (barrier layer). Next, a large number of holes formed in the barrier layer were etched using a 20-fold diluted phosphoric acid solution such that each hole became a through hole, thereby obtaining an alumina mask with an average hole diameter of 250 nm and with a hole density of $7.0 \times 10^8$ holes/cm$^2$. By depositing Ag on the microcrystalline SiO$_x$:H layer in a vacuum through the alumina mask thus formed, an array of metal nanoparticles having a height of 125 nm was formed.

EXAMPLE 1-4

The solar cell according to Example 1-4 was produced according to the same procedure as that in Example 1-1, except for the production process for the metal nanoparticles.
[Production of Metal Nanoparticles]

After the surface of an aluminum substrate was anodized at 120 V in an aqueous solution containing 0.3 mol/L malonic acid, the aluminum substrate was removed except for the oxidized area (barrier layer). Next, a large number of holes formed in the barrier layer were etched using a 20-fold diluted phosphoric acid solution such that each hole became a through hole, thereby obtaining an alumina mask with an average hole diameter of 150 nm and with a hole density of $1.8 \times 10^9$ holes/cm$^2$. By depositing Ag with a thickness of 90 nm on the alumina mask thus formed, the alumina mask was configured to have an average hole diameter of 100 nm and a hole density of $1.8 \times 10^9$ holes/cm$^2$. By depositing Ag on the microcrystalline SiO$_x$:H layer in a vacuum through the alumina mask thus formed, an array of metal nanoparticles having a height of 50 nm was formed.

EXAMPLE 1-5

The solar cell according to Example 1-5 was produced according to the same procedure as that in Example 1-1, except for the production process for the metal nanoparticles.
[Production of Metal Nanoparticles]

After the surface of an aluminum substrate was anodized at 160 V in a mixed aqueous solution containing 0.2 mol/L malonic acid and 0.2 mol/L tartaric acid, the aluminum substrate was removed except for the oxidized area (barrier layer). Next, a large number of holes formed in the barrier layer were etched using a 20-fold diluted phosphoric acid solution such that each hole became a through hole, thereby obtaining an alumina mask with an average hole diameter of 200 nm and with a hole density of $1.8 \times 10^9$ holes/cm$^2$. By depositing Ag with a thickness of 300 nm on the alumina mask thus formed, the alumina mask was configured to have an average hole diameter of 100 nm and a hole density of $1.0 \times 10^9$ holes/cm$^2$. By depositing Ag on the microcrystalline SiO$_x$:H layer in a vacuum through the alumina mask thus formed, an array of metal nanoparticles having a height of 50 nm was formed.

EXAMPLE 1-6

The solar cell according to Example 1-6 was produced according to the same procedure as that in Example 1-1, except for the production process for the metal nanoparticles.
[Production of Metal Nanoparticles]

After the surface of an aluminum substrate was anodized at 120 V in an aqueous solution containing 0.3 mol/L malonic acid, the aluminum substrate was removed except for the oxidized area (barrier layer). Next, a large number of holes formed in the barrier layer were etched using a 20-fold diluted phosphoric acid solution such that each hole became a through hole having an increased diameter, thereby obtaining an alumina mask with an average hole diameter of 200 nm and with a hole density of $1.8 \times 10^9$ holes/cm$^2$. By depositing Ag on the microcrystalline SiO$_x$:H layer in a vacuum through the alumina mask thus formed, an array of metal nanoparticles having a height of 100 nm was formed.

COMPARISON EXAMPLE 1-1

The solar cell according to Comparison example 1-1 was produced according to the same procedure as that in Example 1-1, except for the production process for the metal nanoparticles.
[Production of Metal Nanoparticles]

After the surface of an aluminum substrate was anodized at 80 V in a mixed aqueous solution containing 0.1 mol/L oxalic acid and 0.1 mol/L malonic acid, the aluminum substrate was removed except for the oxidized area (barrier layer). Next, a large number of holes formed in the barrier layer were etched using a 20-fold diluted phosphoric acid solution such that each hole became a through hole, thereby obtaining an alumina mask with an average hole diameter of 100 nm and with a hole density of $3.3 \times 10^9$ holes/cm$^2$. By depositing Ag on the microcrystalline SiO$_x$:H layer in a vacuum through the alumina mask thus formed, an array of metal nanoparticles having a height of 50 nm was formed.

COMPARISON EXAMPLE 1-2

The solar cell according to Comparison example 1-2 was produced according to the same procedure as that in Example 1-1, except for the production process for the metal nanoparticles.

[Production of Metal Nanoparticles]

After the surface of an aluminum substrate was anodized at 240 V in an aqueous solution containing 0.15 mol/L citric acid, the aluminum substrate was removed except for the oxidized area (barrier layer). Next, a large number of holes formed in the barrier layer were etched using a 20-fold diluted phosphoric acid solution such that each hole became a through hole, thereby obtaining an alumina mask with an average hole diameter of 300 nm and with a hole density of $4.0 \times 10^8$ holes/cm$^2$. By depositing Ag on the microcrystalline SiO$_x$:H layer in a vacuum through the alumina mask thus formed, an array of metal nanoparticles having a height of 150 nm was formed.

[Measurement of Quantum Efficiency]

Figure 4:
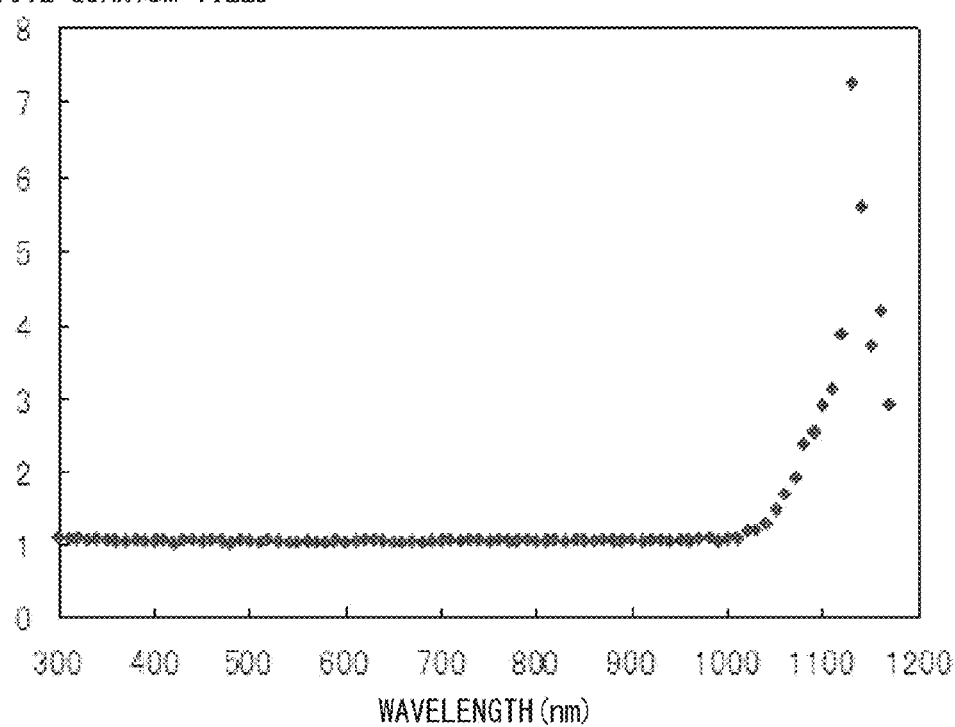
FIG. 4 is a graph showing the quantum yield of the solar cell according to Example 1-2.

Spectral sensitivity measurement was performed for the respective solar cells according to Examples 1-1 to 1-6 and Comparison examples 1-1 and 1-2. The spectral sensitivity measurement was performed using a spectral sensitivity measurement apparatus configured as a two-lamp system employing a xenon lamp and a halogen lamp. Specifically, the measurement was performed in the AC mode while inputting monochromatic light ranging between 300 and 1200 nm dispersed by a monochromator, and the quantum yield was calculated for each wavelength based upon the number of input photons and the photocurrent value for each wavelength. A solar cell was produced as a reference sample using the same procedure as in Example 1-1, except that the metal nanoparticles were not produced, and the spectral sensitivity measurement was performed for the reference sample thus produced. With this measurement result as the base, the relative quantum yield with respect to the reference sample was calculated for the respective solar cells according to Examples 1-1 through 1-6, and Comparison examples 1-1 and 1-2. FIG. 4 is a graph showing the quantum yield of the solar cell according to Example 1-2. Furthermore, Table 1 shows the quantum yield of each of the respective solar cells at the wavelength of 1100 nm according to Examples 1-1 through 1-6, and Comparison examples 1-1 and 1-2. As shown in Table 1, the solar cells according to Examples 1-1 through 1-6 each exhibited a marked increase in the quantum yield as compared with the solar cells according to Comparison examples 1-1 and 1-2. That is to say, it has been confirmed that the solar cells according to Examples 1-1 through 1-6 each have the advantage of improved light absorption.

TABLE 1

| | METAL NANOPARTICLE | | | RELATIVE QUANTUM EFFICIENCY AT 1100 nm |
|---|---|---|---|---|
| | MATERIAL | PARTICLE DENSITY (PARTICLES/cm$^2$) | PARTICLE DIAMETER (nm) | |
| EXAMPLE 1 | Ag | $1.8 \times 10^9$ | 150 | 2.5 |
| EXAMPLE 2 | Ag | $1.0 \times 10^9$ | 200 | 3.1 |
| EXAMPLE 3 | Ag | $7.0 \times 10^8$ | 250 | 2.5 |
| EXAMPLE 4 | Ag | $1.8 \times 10^9$ | 100 | 2.4 |
| EXAMPLE 5 | Ag | $1.0 \times 10^9$ | 100 | 2.2 |
| EXAMPLE 6 | Ag | $1.8 \times 10^9$ | 200 | 3.4 |
| COMPARISON EXAMPLE 1 | Ag | $3.3 \times 10^9$ | 100 | 1.1 |
| COMPARISON EXAMPLE 2 | Ag | $4.0 \times 10^8$ | 300 | 1.2 |

[Embodiment 3]

Figure 5A:
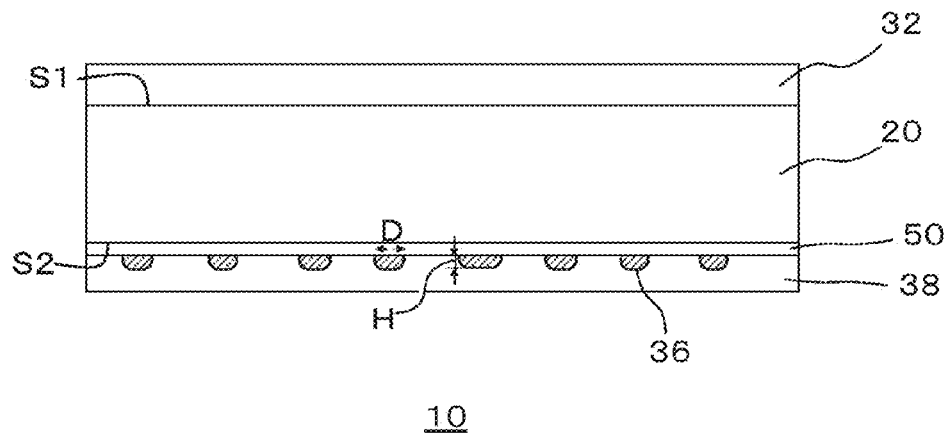
FIG. 5A is a schematic cross-sectional diagram showing a structure of a photoelectric conversion element according to embodiments 3 and 4.
Figure 5B:
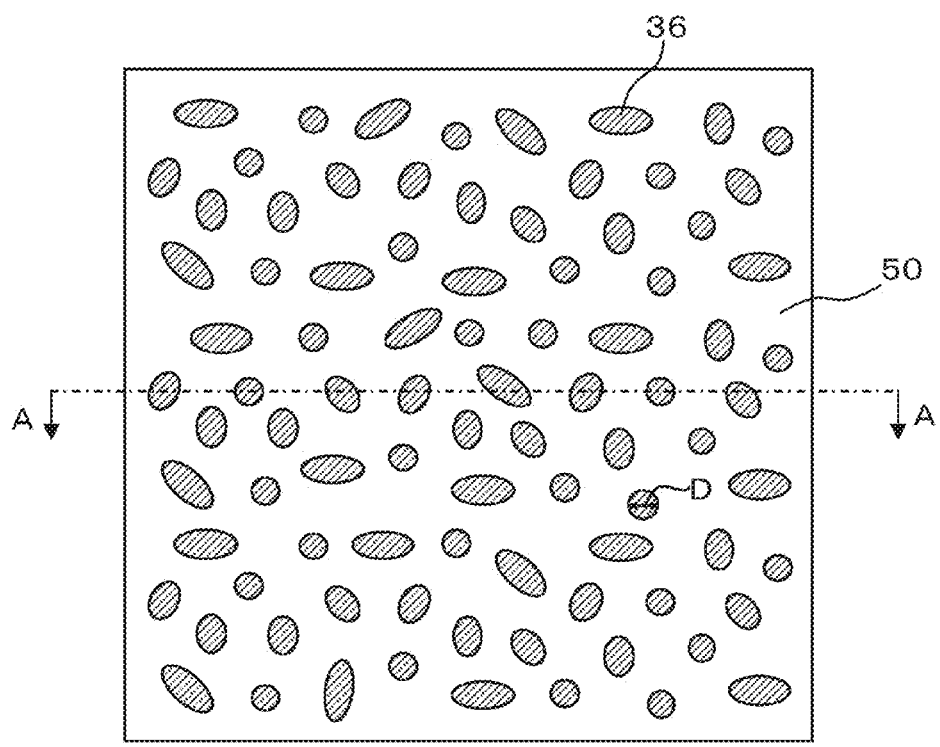
FIG. 5B is a plan view showing the layout of metal nanoparticles when a semiconductor substrate is shown from its back face side.

FIG. 5A is a schematic cross-sectional diagram showing a structure of a photoelectric conversion element according to embodiments 3 and 4. FIG. 5B is a plan view showing the layout of the metal nanoparticles of the photoelectric conversion element as viewed from the side that is opposite to the light receiving face. FIG. 5A corresponds to a cross-sectional view taken along line A-A in FIG. 5B. In FIG. 5B, the dielectric layer 38 is not shown.

As shown in FIG. 5A, a photoelectric conversion element 10 includes a photoelectric conversion layer 20, an antireflection film 32, multiple metal nanoparticles 36, a dielectric layer 38, and a transparent thin film 50. With the present embodiment, the photoelectric conversion element 10 is configured as a solar cell.

The photoelectric conversion layer 20 has the same structure as that of the photoelectric conversion layer 20 according to the embodiment 1 described above. It should be noted that the photoelectric conversion layer 20 may be configured as a polysilicon substrate. Also, the structure of the photoelectric conversion layer 20 is not restricted in particular as long as it provides photoelectric conversion. Also, a p-i-n junction may be formed in the photoelectric conversion layer 20.

The photoelectric conversion layer 20 has a first principal face S1 and a second principal face S2 that are mutually opposite. The photoelectric conversion layer 20 is arranged such that the first principal face S1 is positioned on the light receiving face side of the photoelectric conversion element 10 (upper face side in FIG. 5A), and such that the second principal face S2 is positioned on the side that is opposite to the light receiving face of the photoelectric conversion element 10 (lower face side in FIG. 5A).

The antireflection film 32 is provided to the first principal face S1 of the photoelectric conversion layer 20. The structure and the material of the antireflection film 32 are the same as those of the antireflection film 32 according to the embodiment 1 described above.

The multiple metal nanoparticles 36 are arranged in a two-dimensional manner on the principal face side of the photoelectric conversion layer 20. With the present embodiment, the multiple metal nanoparticles 36 are arranged in a two-dimensional manner on the second principal face S2 side of the photoelectric conversion layer 20. More specifically, the multiple metal nanoparticles 36 are dotted on the surface of the transparent thin film 50 arranged on the second principal face S2 side of the photoelectric conversion layer 20 as described later.

The material of the nanoparticles 36 is the same as that of the metal nanoparticles 36 according to the embodiment 1 described above.

The three-dimensional form of each metal nanoparticle 36 is not restricted in particular. Examples of the form of each metal nanoparticle 36 include a spherical form, a semi-spherical form, a cylindrical form, a prismatic form, a rod-shaped form, a disc-shaped form, and so forth. Furthermore, as viewed along the direction that is approximately orthogonal to the principal face of the photoelectric conversion layer 20, i.e., when the photoelectric conversion layer 20 is shown in a plan view, the structure of each metal nanoparticle 36 satisfies at least one from among the following conditions (1) through (9) with respect to their degree of circularity.

Here, "degree of circularity" is an index which represents how close the shape of the metal nanoparticle 36 is to a circle as viewed along the direction that is approximately orthogonal to the principal face of the photoelectric conversion layer 20 (in a plan view). The degree of circularity is represented by the following Expression (1). As the degree of circularity becomes closer to 1, the shape of the metal nanoparticle 36 becomes closer to a circle.

$$\text{Degree of circularity} = 4\pi \cdot S/L^2 \quad (1)$$

S: Area of the metal nanoparticle 36 as viewed in a plan view.

L: Circumferential length of the metal nanoparticle 36 as viewed in a plan view.

Condition (1): As viewed in a plan view, the number of metal nanoparticles 36 having a degree of circularity that is greater than 0 and is equal to or smaller than 0.3 is 0.3% or more of the total number of the multiple metal nanoparticles 36.

Condition (2): As viewed in a plan view, the number of metal nanoparticles 36 having a degree of circularity that is greater than 0 and is equal to or smaller than 0.4 is 1% or more of the total number of the multiple metal nanoparticles 36.

Condition (3): As viewed in a plan view, the number of metal nanoparticles 36 having a degree of circularity that is greater than 0 and is equal to or smaller than 0.5 is 3% or more of the total number of the multiple metal nanoparticles 36.

Condition (4): As viewed in a plan view, the number of metal nanoparticles 36 having a degree of circularity that is greater than 0 and is equal to or smaller than 0.6 is 6% or more of the total number of the multiple metal nanoparticles 36.

Condition (5): As viewed in a plan view, the number of metal nanoparticles 36 having a degree of circularity that is equal to or greater than 0.3 and is equal to or smaller than 0.4 is 1% or more of the total number of the multiple metal nanoparticles 36.

Condition (6): As viewed in a plan view, the number of metal nanoparticles 36 having a degree of circularity that is equal to or greater than 0.4 and is equal to or smaller than 0.5 is 3% or more of the total number of the multiple metal nanoparticles 36.

Condition (7): As viewed in a plan view, the number of metal nanoparticles 36 having a degree of circularity that is equal to or greater than 0.5 and is equal to or smaller than 0.6 is 4% or more of the total number of the multiple metal nanoparticles 36.

Condition (8): The multiple metal nanoparticles 36 have an average degree of circularity of 0.8 or less as viewed in a plan view.

Condition (9): As viewed in a plan view, the multiple metal nanoparticles 36 exhibit a "10% degree of circularity" of 0.6 or less, which is defined as follows.

Here, with a number equaling 10% of the total quantity of the multiple metal nanoparticle 36 as N, the "10% degree of circularity" represents the degree of circularity of N-th metal nanoparticles 36 when the multiple metal nanoparticles 36 are sorted in ascending order of the degree of circularity.

In a case in which the multiple metal nanoparticles 36 respectively have a form which satisfies any one of the conditions (1) through (9), the multiple metal nanoparticles 36 possess a broad degree of circularity distribution. This allows the photoelectric conversion layer 20 to absorb light with high efficiency over a wider wavelength range. As a result, such an arrangement provides the photoelectric conversion element 10 with improved photoelectric conversion efficiency.

With the photoelectric conversion layer 20 shown in a plan view, the metal nanoparticles 36, which have an approximately circular shape, are each configured to have a diameter D ranging between approximately 10 nm and approximately 1000 nm, for example. Furthermore, with the principal face of the transparent thin film 50 that is opposite to the photoelectric conversion layer 20 as the base level, each metal nanoparticle 36 is configured to have a height H ranging between approximately 5 nm and approximately 500 nm, for example.

With the photoelectric conversion layer 20 shown in a plan view, the particle density of the metal nanoparticles 36 per unit area is preferably set to a range between $1.0 \times 10^7$ particles/cm$^2$ and $1.0 \times 10^{10}$ particles/cm$^2$, more preferably set to a range between $1.0 \times 10^8$ particles/cm$^2$ and $5.0 \times 10^9$ particles/cm$^2$, and even more preferably set to a range between $5.0 \times 10^8$ particles/cm$^2$ and $2.0 \times 10^9$ particles/cm$^2$.

The transparent thin film 50 is provided between the multiple metal nanoparticles 36 and the photoelectric conversion layer 20. That is to say, the transparent thin film 50 is provided to the second principal face S2 of the photoelectric conversion layer 20. The transparent thin film 50 is transparent to the light to be received by the photoelectric conversion element 10. That is to say, the transparent thin film 50 has a bandgap that is greater than that of the photoelectric conversion layer 20. Furthermore, in a case in which an electrode is formed on the second principal face S2 side of the photoelectric conversion layer 20, from the viewpoint of improving the current collecting efficiency, the transparent thin film 50 is preferably configured to have electrical conductivity.

The material, the thickness, the oxygen content, and the refractive index, of the transparent thin film 50, are the same as those of the transparent thin film 50 according to the embodiment 2 described above.

With the photoelectric conversion element 10 according to the present embodiment, the transparent thin film 50 is provided between the metal nanoparticles 36 and the second principal face S2 of the photoelectric conversion layer 20. Thus, each metal nanoparticle 36 is not in contact with the second principal face S2 of the photoelectric conversion layer 20. In a case in which each metal nanoparticle 36 is in contact with the photoelectric conversion layer 20, such a configuration leads to carrier recombination in the metal-semiconductor interface between each metal nanoparticle 36 and the photoelectric conversion layer 20, or leads to contamination of the photoelectric conversion layer 20 due to migration of the metal atom clusters, of which the metal nanoparticles 36 are constituted, into the photoelectric conversion layer 20. In some cases, this leads to a problem of degradation of the photoelectric conversion efficiency of the photoelectric conversion element 10. In contrast, with the present embodiment, the transparent thin film 50 is provided between the second principal face S2 of the photoelectric conversion layer 20 and each metal nanoparticle 36. Thus, such an arrangement is capable of suppressing carrier recombination in the interface between each metal nanoparticle 36 and the photoelectric conversion layer 20. Furthermore, by configuring the transparent thin film 50 with an oxygen concentration of 5 atm % or more, such an arrangement is capable of effectively preventing the metal atom clusters of which the metal nanoparticles 36 are constituted from migrating to the photoelectric conversion layer 20.

Furthermore, with the refractive index of the transparent thin film 50 as $n_1$, and with the refractive index of the photoelectric conversion layer 20 as $n_2$, by satisfying the relation expression $n_1 > 0.7 \cdot n_2$, such an arrangement allows the scattering angle of the reflected light from the metal nanoparticles 36 to be further increased. Thus, such an arrangement provides a further increased light path length in the photoelectric conversion layer 20.

The dielectric layer 38 is arranged on the second principal face S2 side of the photoelectric conversion layer 20 so as to coat at least the surface of each metal nanoparticle 36. The dielectric layer 38 is preferably configured to have a refractive index of 1.3 or more. The dielectric layer 38 is configured to be transparent to the light to be received by the photoelectric conversion element 10. That is to say, the dielectric layer 38 has a bandgap that is greater than that of the photoelectric conversion layer 20. Furthermore, in a case in which an electrode is formed on the dielectric layer 38, from the viewpoint of improving the current collecting efficiency, the dielectric layer 38 is preferably configured to have electrical conductivity.

The material and the thickness of the dielectric layer 38 are the same as those of the dielectric layer 38 according to the embodiment 1 described above.

[Production Method for Photoelectric Conversion Element]

Description will be made with reference to FIGS. 6A through 6E regarding a production method for a photoelectric conversion element 10 according to the present embodiment. FIGS. 6A through 6E are cross-sectional process diagrams each showing a production method for the photoelectric conversion element according to the embodiments 3 and 4.

Figure 6A:
FIGS. 6A through 6E are cross-sectional process diagrams showing a production method for the photoelectric conversion element according to the embodiments 3 and 4.

First, as shown in FIG. 6A, the antireflection film 32 having a film thickness of 50 to 200 nm is laminated on the first principal face S1 of the photoelectric conversion layer 20 configured as a light receiving face. It should be noted that the photoelectric conversion layer 20 includes a p-type monocrystalline silicon substrate. Furthermore, a p-n junction is formed beforehand in the photoelectric conversion layer 20 using a known method such as a thermal diffusion method, an ion injection method, a vacuum film deposition method, or the like. The method for forming the antireflection film 32 is not restricted in particular. Examples of such a method include a vacuum film deposition method in which a transparent material such as $SiN_x$, ITO, or the like, is deposited as a film on the photoelectric conversion layer 20 in a vacuum.

Figure 6B:
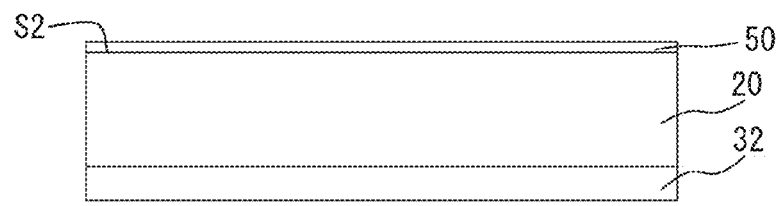

Next, as shown in FIG. 6B, the transparent thin film 50 having a film thickness of 5 to 200 nm is laminated on the second principal face S2 of the photoelectric conversion layer 20. The method for forming the transparent thin film 50 is not restricted in particular. As with the method for forming the antireflection film 32, examples of such a method includes a vacuum film deposition method in which a transparent material such as μc-Si:H (microcrystalline Si:H), ITO, or the like is deposited on the photoelectric conversion layer 20 in a vacuum.

Figure 6C:
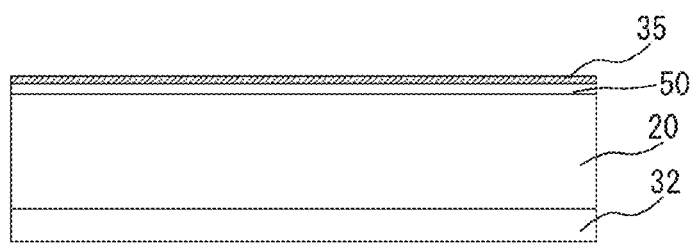

Next, as shown in FIG. 6C, a metal thin film 35 having a film thickness of 1 to 200 nm is laminated on the principal face of the transparent thin film 50, for example. The method for forming the metal thin film 35 is not restricted in particular. Examples of such a method include a method in which a metal material such as Ag, Al, Au, Cu, or the like, or otherwise an alloy material containing such metal materials, is deposited on the transparent thin film 50 using a vacuum deposition method, thereby forming a metal thin film 35.

Figure 6D:
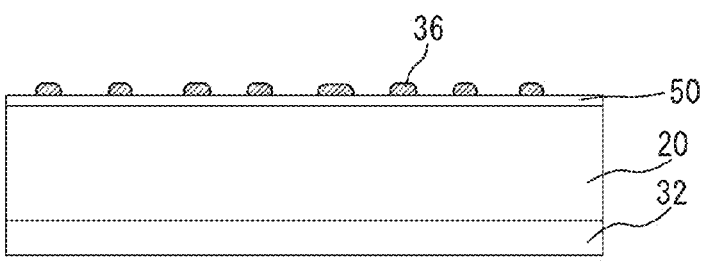

Next, as shown in FIG. 6D, the metal thin film 35 is heated, whereby the shape of the metal thin film 35 is changed into a multi-particle structure. The metal thin film 35 is heated at a heating temperature of 100 to 500° C., for example. As a result, multiple metal nanoparticles 36 are arranged in a two-dimensional manner on the transparent thin film 50. By adjusting the film thickness of the metal thin film 35, the heating temperature, or the like, such an arrangement allows the degree of circularity of the multiple nanoparticles 36 to be adjusted.

Figure 6E:
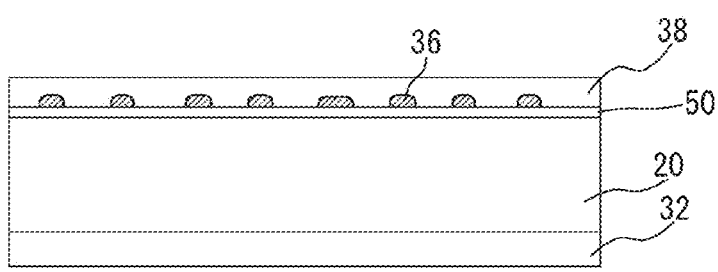

Next, as shown in FIG. 6E, the dielectric layer 38 is laminated so as to coat the surface of the metal nanoparticles 36. The method for forming the dielectric layer 38 is not restricted in particular. As with the method for forming the antireflection film 32, examples of such a method include a method in which a dielectric material such as ITO, ZnO, or the like, is deposited using a vacuum deposition method.

By performing the steps described above, such an arrangement allows the photoelectric conversion element 10 according to the present embodiment to be produced in a simple manner. Thus, the costs for manufacturing the photoelectric conversion element 10 can be reduced.

With the photoelectric conversion element 10 according to the embodiment 3 described above, incident light that could not be absorbed by the photoelectric conversion layer 20 is scattered and reflected due to the strong light scattering property of the localized surface plasmon. Thus, such an arrangement provides an increase in the light path length of the incident light in the photoelectric conversion layer 20, thereby allowing the incident light to be absorbed with high efficiency. Furthermore, the multiple metal nanoparticles 36 exhibit a broad degree of circularity distribution, thereby allowing the photoelectric conversion layer 20 to absorb light with high efficiency over a wide wavelength range. As a result, such an arrangement provides the photoelectric conversion element 10 with improved photoelectric conversion efficiency.

Furthermore, with the photoelectric conversion element 10 according to the present embodiment, the multiple metal nanoparticles 36 are coated with the dielectric layer 38. This prevents the metal nanoparticles 36 from being exposed to air or water, thereby providing the metal nanoparticles 36 with improved stability. Moreover, in a case in which the photoelectric conversion layer 20 is highly transparent to light on the long-wavelength side, by shifting the effective wavelength of the metal nanoparticles 36 to the long-wavelength side, such an arrangement provides improved scattering characteristics.

Detailed description will be made below regarding the present invention with reference to examples. However, the present invention is by no means intended to be restricted to such examples.

EXAMPLE 2-1

[Production of Photoelectric Conversion Layer]

An a-Si:H layer having a thickness of 5 nm was formed as an i-layer on one face of a p-type silicon wafer (having a resistivity of 0.5 to 5 Ωcm) having a thickness of 100 μm. Furthermore, an n-type a-Si:H layer having a thickness of 7.5 nm was laminated on the i-layer, thereby forming a photoelectric conversion layer. The results of using a spectroscopic ellipsometer to measure the refractive index of the p-type silicon wafer indicated a refractive index of 3.9 at a wavelength of 600 nm.

[Formation of Antireflection Film]

An ITO layer having a thickness of 75 nm was formed as an antireflection film on the n-type a-Si:H layer.

[Production of Transparent Thin Film]

A p-type microcrystalline Si:H layer having a thickness of 30 nm was formed as a transparent thin film on an exposed face (back face) of the p-type silicon wafer.

[Production of Metal Nanoparticles]

An Ag thin film having a thickness of 5 nm was formed as a metal thin film on the surface of the transparent thin film using an evaporation method. The Ag thin film thus formed was heated at 200° C. so as to form multiple Ag nanoparticles on the transparent thin film.

[Production of Dielectric Layer]

As a dielectric layer configured to coat the Ag nanoparticles, a ZnO layer having a thickness of 200 nm was formed.

[Production of Electrodes]

A thin-line electrode was formed using an Ag material on the ITO layer configured as an antireflection film. Furthermore, a whole-surface electrode was formed using an Ag material on the face of the ZnO layer configured as a dielectric layer (on the principal face of the ZnO layer that is opposite to the transparent thin film).

By performing the aforementioned steps, the photoelectric conversion element (solar cell) according to Example 2-1 was produced.

EXAMPLE 2-2

A solar cell according to Example 2-2 was produced according to the same procedure as that in Example 2-1, except for the method for forming the metal nanoparticles.
[Production of Metal Nanoparticles]

An Ag thin film having a thickness of 10 nm was formed as a metal thin film on the surface of the transparent thin film using an evaporation method. The Ag thin film thus formed was heated at 200° C. so as to form multiple Ag nanoparticles on the transparent thin film.

EXAMPLE 2-3

A solar cell according to Example 2-3 was produced according to the same procedure as that in Example 2-1, except for the method for forming the metal nanoparticles.
[Production of Metal Nanoparticles]

An Ag thin film having a thickness of 15 nm was formed as a metal thin film on the surface of the transparent thin film using an evaporation method. The Ag thin film thus formed was heated at 200° C. so as to form multiple Ag nanoparticles on the transparent thin film.

EXAMPLE 2-4

A solar cell according to Example 2-4 was produced according to the same procedure as that in Example 2-1, except for the method for forming the metal nanoparticles.
[Production of Metal Nanoparticles]

An Ag thin film having a thickness of 20 nm was formed as a metal thin film on the surface of the transparent thin film using an evaporation method. The Ag thin film thus formed was heated at 200° C. so as to form multiple Ag nanoparticles on the transparent thin film.

EXAMPLE 2-5

A solar cell according to Example 2-5 was produced according to the same procedure as that in Example 2-1, except for the method for forming the metal nanoparticles.
[Production of Metal Nanoparticles]

An Ag thin film having a thickness of 25 nm was formed as a metal thin film on the surface of the transparent thin film using an evaporation method. The Ag thin film thus formed was heated at 200° C. so as to form multiple Ag nanoparticles on the transparent thin film.

EXAMPLE 2-6

A solar cell according to Example 2-6 was produced according to the same procedure as that in Example 2-1, except for the method for forming the metal nanoparticles.
[Production of Metal Nanoparticles]

An Ag thin film having a thickness of 30 nm was formed as a metal thin film on the surface of the transparent thin film using an evaporation method. The Ag thin film thus formed was heated at 200° C. so as to form multiple Ag nanoparticles on the transparent thin film.

EXAMPLE 2-7

A solar cell according to Example 2-7 was produced according to the same procedure as that in Example 2-1, except for the method for forming the metal nanoparticles.
[Production of Metal Nanoparticles]

An Ag thin film having a thickness of 35 nm was formed as a metal thin film on the surface of the transparent thin film using an evaporation method. The Ag thin film thus formed was heated at 200° C. so as to form multiple Ag nanoparticles on the transparent thin film.

COMPARISON EXAMPLE 2-1

A solar cell according to Comparison example 2-1 was produced according to the same procedure as in Example 2-1, except that the metal nanoparticles were not formed.

COMPARISON EXAMPLE 2-2

A solar cell according to Comparison example 2-2 was produced according to the same procedure as in Example 2-1, except for the method for forming the metal nanoparticles.
[Production of Metal Nanoparticles]

After the surface of an aluminum substrate was anodized at 80 V in a mixed aqueous solution containing 0.1 mol/L oxalic acid and 0.1 mol/L malonic acid, the aluminum substrate was removed except for the oxidized area (barrier layer). Next, a large number of holes formed in the barrier layer were etched using a 20-fold diluted phosphoric acid solution such that each hole became a through hole, thereby obtaining an alumina mask having multiple through holes. By depositing Ag on the transparent thin film through the alumina mask thus formed, multiple Ag nanoparticles having a height of 50 nm ware formed.

COMPARISON EXAMPLE 2-3

A solar cell according to Comparison example 2-3 was produced according to the same procedure as in Example 2-1, except for the method for forming the metal nanoparticles.
[Production of Metal Nanoparticles]

After the surface of an aluminum substrate was anodized at 240 V in an aqueous solution containing 0.15 mol/L citric acid, the aluminum substrate was removed except for the oxidized area (barrier layer). Next, a large number of holes formed in the barrier layer were etched using a 20-fold diluted phosphoric acid solution such that each hole became a through hole, thereby obtaining an alumina mask having multiple through holes. By depositing Ag on the transparent thin film through the alumina mask thus formed, multiple Ag nanoparticles having a height of 50 nm ware formed.

COMPARISON EXAMPLE 2-4

A solar cell according to Comparison example 2-4 was produced according to the same procedure as in Example 2-1, except for the method for forming the metal nanoparticles.
[Production of Metal Nanoparticles]

The transparent thin film was coated with an Ag nanoparticle dispersion liquid (containing Ag nanoparticles having an average particle diameter of 150 nm) prepared using a wet mixing method, so as to form multiple Ag nanoparticles on the transparent thin film.

COMPARISON EXAMPLE 2-5

A solar cell according to Comparison example 2-5 was produced according to the same procedure as in Example 2-1, except for the method for forming the metal nanoparticles.

[Production of Metal Nanoparticles]

The transparent thin film was coated with an Ag nanoparticle dispersion liquid (containing Ag nanoparticles having an average particle diameter of 200 nm) prepared using a wet mixing method, so as to form multiple Ag nanoparticles on the transparent thin film.

[Measurement of Degree of Circularity of Metal Nanoparticles]

Regarding the solar cells according to Examples 2-1 through 2-7 and Comparison examples 2-1 through 2-5, measurement was performed of the degree of circularity of the Ag nanoparticles as viewed along a direction that is approximately orthogonal to the principal face of the photoelectric conversion layer. The measurement of the degree of circularity of the Ag nanoparticles was performed by analyzing an image obtained by a scanning electron microscope (SEM). The image analysis was performed using ImageJ version 1.42q. As a method for extracting a region of the Ag nanoparticles to be measured from a SEM image, the Li method (Li, CH & Tam, PKS (1998), "An Iterative Algorithm for Minimum Cross Entropy Thresholding", Pattern Recognition Letters 18(8): 771-776) was used to extract a region having high brightness from the SEM image. The region thus extracted was subjected to particle detection processing using a particle detection function included in ImageJ, so as to calculate the degree of circularity of the individual Ag nanoparticles included in the region thus extracted. Furthermore, the average degree of circularity and the 10% degree of circularity were calculated for the Ag nanoparticles included in the region thus extracted. Table 2 shows the distribution of the degree of circularity, the average degree of circularity, and the 10% degree of circularity, for each example and for each comparison example.

of 0 to 0.4 was 1% or more. In contrast, it has been confirmed that, with Comparison examples 2-2 through 2-5, the number of such Ag nanoparticles was smaller than 1%.

It has been confirmed that, with Examples 2-1 through 2-7, the number of Ag nanoparticles having a degree of circularity of 0 to 0.5 was 3% or more. In contrast, it has been confirmed that, with Comparison examples 2-2 through 2-5, the number of such Ag nanoparticles was smaller than 3%.

It has been confirmed that, with Examples 2-1 through 2-7, the number of Ag nanoparticles having a degree of circularity of 0 to 0.6 was 6% or more. In contrast, it has been confirmed that, with Comparison examples 2-2 through 2-5, the number of such Ag nanoparticles was smaller than 6%.

It has been confirmed that, with Examples 2-1 through 2-7, the number of Ag nanoparticles having a degree of circularity of 0.3 to 0.4 was 1% or more. In contrast, it has been confirmed that, with Comparison examples 2-2 through 2-5, the number of such Ag nanoparticles was smaller than 1%.

It has been confirmed that, with Examples 2-1 through 2-7, the number of Ag nanoparticles having a degree of circularity of 0 to 0.4 was 1% or more. In contrast, it has been confirmed that, with Comparison examples 2-2 through 2-5, the number of such Ag nanoparticles was smaller than 1%.

It has been confirmed that, with Examples 2-1 through 2-7, the number of Ag nanoparticles having a degree of circularity of 0.4 to 0.5 was 3% or more. In contrast, it has been confirmed that, with Comparison examples 2-2 through 2-5, the number of such Ag nanoparticles was smaller than 3%.

It has been confirmed that, with Examples 2-1 through 2-7, the number of Ag nanoparticles having a degree of circularity of 0.5 to 0.6 was 4% or more. In contrast, it has been confirmed that, with Comparison examples 2-2 through 2-5, the number of such Ag nanoparticles was smaller than 4%.

TABLE 2

| | RATIO OF METAL NANOPARTICLES HAVING DEGREE OF CIRCULARITY RANGING BETWEEN X AND Y(%) | | | | | | | | | | |
|---|---|---|---|---|---|---|---|---|---|---|---|
| | X | | | | | | | | | | |
| | 0 | 0 | 0 | 0 | 0 | 0.3 | 0.4 | 0.5 | 0.6 | | |
| | Y | | | | | | | | | AVERAGE DEGREE | 10% DEGREE OF |
| | 0.3 | 0.4 | 0.5 | 0.6 | 0.7 | 0.4 | 0.5 | 0.6 | 0.7 | OF CIRCULARITY | CIRCULARITY |
| EXAMPLE 1 | 7.1 | 12.5 | 22 | 30 | 32 | 5.4 | 9.5 | 8.3 | 1.9 | 0.68 | 0.33 |
| EXAMPLE 2 | 2.3 | 7.4 | 14 | 22 | 26 | 5.1 | 6.8 | 8 | 3.8 | 0.73 | 0.45 |
| EXAMPLE 3 | 2.1 | 6.7 | 12 | 22 | 24 | 4.6 | 5.7 | 9.8 | 2.2 | 0.78 | 0.47 |
| EXAMPLE 4 | 12 | 21 | 32 | 41 | 53 | 9 | 11 | 9.6 | 12 | 0.63 | 0.28 |
| EXAMPLE 5 | 3.2 | 8.3 | 15 | 25 | 38 | 5.1 | 7.1 | 9.5 | 13 | 0.71 | 0.43 |
| EXAMPLE 6 | 2.5 | 7.1 | 14 | 22 | 33 | 4.6 | 7.1 | 7.9 | 11 | 0.72 | 0.45 |
| EXAMPLE 7 | 4.6 | 10 | 19 | 28 | 35 | 5.4 | 8.6 | 9.4 | 7.1 | 0.7 | 0.39 |
| COMPARISON EXAMPLE 1 | — | — | — | — | — | — | — | — | — | — | — |
| COMPARISON EXAMPLE 2 | 0 | 0.1 | 1.1 | 3.1 | 3.9 | 0.1 | 1.1 | 2 | 0.8 | 0.91 | 0.84 |
| COMPARISON EXAMPLE 3 | 0.1 | 0.7 | 2.5 | 5.6 | 24 | 0.5 | 1.8 | 3.2 | 18 | 0.83 | 0.71 |
| COMPARISON EXAMPLE 4 | 0.2 | 0.9 | 2.9 | 4 | 11 | 0.6 | 1.9 | 1.3 | 6.8 | 0.89 | 0.69 |
| COMPARISON EXAMPLE 5 | 0.2 | 0.9 | 2.8 | 4 | 20 | 0.6 | 2 | 1.2 | 16 | 0.88 | 0.68 |

As shown in Table 2, it has been confirmed that, with Examples 2-1 through 2-7, the number of Ag nanoparticles having a degree of circularity of 0 to 0.3 was 0.3% or more. In contrast, it has been confirmed that, with Comparison examples 2-2 through 2-5, the number of such Ag nanoparticles was smaller than 0.3%.

It has been confirmed that, with Examples 2-1 through 2-7, the number of Ag nanoparticles having a degree of circularity It has been confirmed that, with Examples 2-1 through 2-7, the Ag nanoparticles exhibited an average degree of circularity of 0.8 or less. In contrast, with Comparison examples 2-2 through 2-5, the Ag nanoparticles exhibited an average degree of circularity that was greater than 0.8.

It has been confirmed that, with Examples 2-1 through 2-7, the Ag nanoparticles exhibited a 10% degree of circularity of 0.6 or less. In contrast, with Comparison examples 2-2 through 2-5, the Ag nanoparticles exhibited a 10% degree of circularity that was greater than 0.6.

[Performance Evaluation of Solar Cells]

By using artificial sunlight having an energy density of 100 mW/cm$^2$, evaluation was performed of the current-voltage characteristics of the solar cells according to Examples 2-1 through 2-7, and the solar cells according to Comparison examples 2-1 through 2-5. With the short-circuit current density obtained in Comparison example 2-1, in which Ag nanoparticles were not formed, as a reference value, the relative short-circuit current density value was calculated for each of Examples 2-1 through 2-7 and for each of Comparison examples 2-2 through 2-5. The calculation results are shown in Table 3.

TABLE 3

| | RELATIVE SHORT-CIRCUIT CURRENT DENSITY VALUE |
|---|---|
| EXAMPLE 1 | 1.025 |
| EXAMPLE 2 | 1.017 |
| EXAMPLE 3 | 1.016 |
| EXAMPLE 4 | 1.032 |
| EXAMPLE 5 | 1.029 |
| EXAMPLE 6 | 1.027 |
| EXAMPLE 7 | 1.017 |
| COMPARISON EXAMPLE 1 | 1 |
| COMPARISON EXAMPLE 2 | 0.999 |
| COMPARISON EXAMPLE 3 | 1.01 |
| COMPARISON EXAMPLE 4 | 1.012 |
| COMPARISON EXAMPLE 5 | 1.01 |

As shown in Table 3, the solar cells according to Examples 2-1 through 2-7 each exhibited a marked increase in the short-circuit current density, as compared with the solar cells according to Comparison examples 2-1 through 2-5. That is to say, it has been confirmed that the solar cells according to Examples 2-1 through 2-7 had an advantage of increased light absorption. Thus, it can be readily understood that the aforementioned degree of circularity distribution provided by Examples 2-1 through 2-7 contributes to improving the performance of the solar cell.

[Embodiment 4] FIG. 5A is a schematic cross-sectional view showing a structure of a photoelectric conversion element according to embodiments 3 and 4. FIG. 5B is a plan view showing the layout of metal nanoparticles when the photoelectric conversion element is shown from a side that is opposite to the light receiving face. FIG. 5A corresponds to a cross-sectional view taken along line A-A in FIG. 5B. In FIG. 5B, the dielectric layer 38 is not shown.

As shown in FIG. 5A, the photoelectric conversion element 10 includes a photoelectric conversion layer 20, an antireflection film 32, multiple metal nanoparticles 36, a dielectric layer 38, and a transparent thin film 50. With the present embodiment, the photoelectric conversion element 10 is configured as a solar cell.

The photoelectric conversion layer 20 has the same structure as that of the photoelectric conversion layer 20 according to the embodiment 1 described above. It should be noted that the photoelectric conversion layer 20 may be configured as a polysilicon substrate. Also, the structure of the photoelectric conversion layer 20 is not restricted in particular as long as it provides photoelectric conversion. Also, a p-i-n junction may be formed in the photoelectric conversion layer 20.

The photoelectric conversion layer 20 has a first principal face S1 and a second principal face S2 that are mutually opposite. The photoelectric conversion layer 20 is arranged such that the first principal face S1 is positioned on the light receiving face side (upper face side in FIG. 5A), and such that the second principal face S2 is positioned on the side that is opposite to the light receiving face of the photoelectric conversion element 10 (lower face side in FIG. 5A).

The antireflection film 32 is provided to the first principal face S1 of the photoelectric conversion layer 20. The structure and the material of the antireflection film 32 are the same as those of the antireflection film 32 according to the embodiment 1 described above.

The multiple metal nanoparticles 36 are arranged in a two-dimensional manner on the principal face side of the photoelectric conversion layer 20. With the present embodiment, the multiple metal nanoparticles 36 are arranged in a two-dimensional manner on the second principal face S2 side of the photoelectric conversion layer 20. More specifically, the multiple metal nanoparticles 36 are dotted on the surface of the transparent thin film 50 arranged on the second principal face S2 side of the photoelectric conversion layer 20 as described later.

The material of the nanoparticles 36 is the same as that of the metal nanoparticles 36 according to the embodiment 1 described above.

The three-dimensional form of each metal nanoparticle 36 is not restricted in particular. Examples of the form of each metal nanoparticle 36 include a spherical form, a semi-spherical form, a cylindrical form, a prismatic form, a rod-shaped form, a disc-shaped form, and so forth. Furthermore, as viewed along the direction that is approximately orthogonal to the principal face of the photoelectric conversion layer 20, i.e., when the photoelectric conversion layer 20 is shown in a plan view, the structure of each metal nanoparticle 36 satisfies at least one from among the following conditions (1) through (3).

Condition (1): The multiple metal nanoparticles 36 exhibit a 1% particle area ratio of 0.1 or less.

Condition (2): The multiple metal nanoparticles 36 exhibit a 5% particle area ratio of 0.2 or less.

Condition (3): The multiple metal nanoparticles 36 exhibit a 10% particle area ratio of 0.3 or less.

Here, with a number equaling X % of the total quantity of the multiple metal nanoparticles 36 as N, the "X % particle area ratio" represents the particle area ratio of N-th metal nanoparticles 36 when the multiple metal nanoparticles 36 are sorted in ascending order of particle area. The aforementioned "particle area ratio" is represented by the following Expression (1).

$$\text{Particle area ratio} = \text{particle area}/\text{average particle area} \quad (1)$$

The "X % particle area ratio" is an index which represents the breadth of the area distribution of the multiple metal nanoparticles 36. For example, in a case in which 1000 metal nanoparticles 36 exhibit a 10% particle area ratio of 1, 99 metal nanoparticles 36, which each have an area that is smaller than that of the 100-th metal nanoparticle 36, are within a range that is smaller than 1 in the particle area ratio distribution. On the other hand, in a case in which 1000 metal nanoparticles 36 exhibit a 10% particle area ratio of 0.3, 99 metal nanoparticles 36 are within a range that is smaller than 0.3 in the particle area ratio distribution. That is to say, if X is maintained at a constant value, as the X % particle area ratio becomes smaller, the number of metal nanoparticles 36 that greatly deviate from the average particle area becomes greater. Thus, if X is maintained at a constant value, as the value of the X % particle area ratio becomes smaller, it means that the area distribution become broader.

In a case in which the multiple metal nanoparticles 36 have a structure that satisfies any one of the aforementioned conditions (1) through (3), the multiple metal nanoparticles 36 have a broad area distribution. Thus, such an arrangement allows the photoelectric conversion layer 20 to absorb light over a broader wavelength range with high efficiency. As a result, such an arrangement provides the photoelectric conversion element 10 with improved photoelectric conversion efficiency.

With the photoelectric conversion layer 20 shown in a plan view, the metal nanoparticles 36, which have an approximately circular shape, are each configured to have a diameter D ranging between approximately 10 nm and approximately 1000 nm, for example. Furthermore, with the principal face of the transparent thin film 50 that is opposite to the photoelectric conversion layer 20 as the base level, each metal nanoparticle 36 is configured to have a height H ranging between approximately 5 nm and approximately 500 nm, for example.

With the photoelectric conversion layer 20 shown in a plan view, the particle density of the metal nanoparticles 36 per unit area is preferably set to a range between $1.0\times10^7$ particles/cm$^2$ and $1.0\times10^{10}$ particles/cm$^2$, more preferably set to a range between $1.0\times10^8$ particles/cm$^2$ and $5.0\times10^9$ particles/cm$^2$, and even more preferably set to a range between $5.0\times10^8$ particles/cm$^2$ and $2.0\times10^9$ particles/cm$^2$.

The transparent thin film 50 is provided between the multiple metal nanoparticles 36 and the photoelectric conversion layer 20. That is to say, the transparent thin film 50 is provided to the second principal face S2 of the photoelectric conversion layer 20. The transparent thin film 50 is transparent to the light to be received by the photoelectric conversion element 10. That is to say, the transparent thin film 50 has a bandgap that is greater than that of the photoelectric conversion layer 20. Furthermore, in a case in which an electrode is formed on the second principal face S2 side of the photoelectric conversion layer 20, from the viewpoint of improving the current collecting efficiency, the transparent thin film 50 is preferably configured to have electrical conductivity.

The material, the thickness, the oxygen content, and the refractive index, of the transparent thin film 50, are the same as those of the transparent thin film 50 according to the embodiment 2 described above.

With the photoelectric conversion element 10 according to the present embodiment, the transparent thin film 50 is provided between the metal nanoparticles 36 and the second principal face S2 of the photoelectric conversion layer 20. Thus, each metal nanoparticle 36 is not in contact with the second principal face S2 of the photoelectric conversion layer 20. In a case in which each metal nanoparticle 36 is in contact with the photoelectric conversion layer 20, such a configuration leads to carrier recombination in the metal-semiconductor interface between each metal nanoparticle 36 and the photoelectric conversion layer 20, or leads to contamination of the photoelectric conversion layer 20 due to migration of the metal atom clusters, of which the metal nanoparticles 36 are constituted, into the photoelectric conversion layer 20. In some cases, this leads to a problem of degradation of the photoelectric conversion efficiency of the photoelectric conversion element 10. In contrast, with the present embodiment, the transparent thin film 50 is provided between the second principal face S2 of the photoelectric conversion layer 20 and each metal nanoparticle 36. Thus, such an arrangement is capable of suppressing carrier recombination in the interface between each metal nanoparticle 36 and the photoelectric conversion layer 20. Furthermore, by configuring the transparent thin film 50 with an oxygen concentration of 5 atm % or more, such an arrangement is capable of effectively preventing the metal atom clusters of which the metal nanoparticles 36 are constituted from migrating to the photoelectric conversion layer 20.

Furthermore, with the refractive index of the transparent thin film 50 as $n_1$, and with the refractive index of the photoelectric conversion layer 20 as $n_2$, by satisfying the relation expression $n_1 > 0.7 \cdot n_2$, such an arrangement allows the scattering angle of the reflected light from the metal nanoparticles 36 to be further increased. Thus, such an arrangement provides a further increased light path length in the photoelectric conversion layer 20.

The dielectric layer 38 is arranged on the second principal face S2 side of the photoelectric conversion layer 20 so as to coat at least the surface of each metal nanoparticle 36. The dielectric layer 38 is preferably configured to have a refractive index of 1.3 or more. The dielectric layer 38 is configured to be transparent to the light to be received by the photoelectric conversion element 10. That is to say, the dielectric layer 38 has a bandgap that is greater than that of the photoelectric conversion layer 20. Furthermore, in a case in which an electrode is formed on the dielectric layer 38, from the viewpoint of improving the current collecting efficiency, the dielectric layer 38 is preferably configured to have electrical conductivity.

The material and the thickness of the dielectric layer 38 are the same as those of the dielectric layer 38 according to the embodiment 1 described above.

[Production Method for Photoelectric Conversion Element]

Description will be made with reference to FIGS. 6A through 6E regarding a production method for a photoelectric conversion element 10 according to the present embodiment. FIGS. 6A through 6E are cross-sectional process diagrams each showing a production method for the photoelectric conversion element according to the embodiments 3 and 4.

First, as shown in FIG. 6A, the antireflection film 32 having a film thickness of 50 to 200 nm is laminated on the first principal face S1 of the photoelectric conversion layer 20 configured as a light receiving face. It should be noted that the photoelectric conversion layer 20 includes a p-type monocrystalline silicon substrate. Furthermore, a p-n junction is formed beforehand in the photoelectric conversion layer 20 using a known method such as a thermal diffusion method, an ion injection method, a vacuum film deposition method, or the like. The method for forming the antireflection film 32 is not restricted in particular. Examples of such a method include a vacuum film deposition method in which a transparent material such as $SiN_x$, ITO, or the like, is deposited as a film on the photoelectric conversion layer 20 in a vacuum.

Next, as shown in FIG. 6B, the transparent thin film 50 having a film thickness of 5 to 200 nm is laminated on the second principal face S2 of the photoelectric conversion layer 20. The method for forming the transparent thin film 50 is not restricted in particular. As with the method for forming the antireflection film 32, examples of such a method include a vacuum film deposition method in which a transparent material such as μc-Si:H (microcrystalline Si:H), ITO, or the like is deposited on the photoelectric conversion layer 20 in a vacuum.

Next, as shown in FIG. 6C, a metal thin film 35 having a film thickness of 1 to 200 nm is laminated on the principal face of the transparent thin film 50, for example. The method for forming the metal thin film 35 is not restricted in particular. Examples of such a method includes a method in which a metal material such as Ag, Al, Au, Cu, or the like, or otherwise an alloy material containing such metal materials, is deposited on the transparent thin film 50 using a vacuum deposition method, thereby forming a metal thin film 35.

Next, as shown in FIG. 6D, the metal thin film 35 is heated, whereby the shape of the metal thin film 35 is changed into a multi-particle structure. The metal thin film 35 is heated at a heating temperature of 100 to 500° C., for example. As a result, multiple metal nanoparticles 36 are arranged in a two-dimensional manner on the transparent thin film 50. By adjusting the film thickness of the metal thin film 35, the heating temperature, or the like, such an arrangement allows the X % particle area ratio of the multiple metal nanoparticles 36 described above to be adjusted.

Next, as shown in FIG. 6E, the dielectric layer 38 is laminated so as to coat the surface of the metal nanoparticles 36. The method for forming the dielectric layer 38 is not restricted in particular. As with the method for forming the antireflection film 32, examples of such a method include a method in which a dielectric material such as ITO, ZnO, or the like, is deposited using a vacuum deposition method.

By performing the steps described above, such an arrangement allows the photoelectric conversion element 10 according to the present embodiment to be produced in a simple manner. Thus, the costs for manufacturing the photoelectric conversion element 10 can be reduced.

With the photoelectric conversion element 10 according to the embodiment 4 described above, incident light that could not be absorbed by the photoelectric conversion layer 20 is scattered and reflected due to the strong light scattering property of the localized surface plasmon. Thus, such an arrangement provides an increase in the light path length of the incident light in the photoelectric conversion layer 20, thereby allowing the incident light to be absorbed with high efficiency. Furthermore, the multiple metal nanoparticles 36 exhibit a broad particle area distribution, thereby allowing the photoelectric conversion layer 20 to absorb light with high efficiency over a wide wavelength range. As a result, such an arrangement provides the photoelectric conversion element 10 with improved photoelectric conversion efficiency.

Furthermore, with the photoelectric conversion element 10 according to the present embodiment, the multiple metal nanoparticles 36 are coated with the dielectric layer 38. This prevents the metal nanoparticles 36 from being exposed to air or water, thereby providing the metal nanoparticles 36 with improved stability. Moreover, in a case in which the photoelectric conversion layer 20 is highly transparent to light on the long-wavelength side, by shifting the effective wavelength of the metal nanoparticles 36 to the long-wavelength side, such an arrangement provides improved scattering characteristics.

Detailed description will be made below regarding the present invention with reference to examples. However, the present invention is by no means intended to be restricted to such examples.

EXAMPLE 3-1

[Production of Photoelectric Conversion Layer]
An a-Si:H layer having a thickness of 5 nm was formed as an i-layer on one face of a p-type silicon wafer (having a resistivity of 0.5 to 5 Ωcm) having a thickness of 100 μm. Furthermore, an n-type a-Si:H layer having a thickness of 7.5 nm was laminated on the i-layer, thereby forming a photoelectric conversion layer. The results of using a spectroscopic ellipsometer to measure the refractive index of the p-type silicon wafer indicated a refractive index of 3.9 at a wavelength of 600 nm.

[Formation of Antireflection Film]
An ITO layer having a thickness of 75 nm was formed as an antireflection film on the n-type a-Si:H layer.
[Production of Transparent Thin Film]
A p-type microcrystalline Si:H layer having a thickness of 30 nm was formed as a transparent thin film on an exposed face (back face) of the p-type silicon wafer.
[Production of Metal Nanoparticles]
An Ag thin film having a thickness of 20 nm was formed as a metal thin film on the surface of the transparent thin film using an evaporation method. The Ag thin film thus formed was heated at 200° C. so as to form multiple Ag nanoparticles on the transparent thin film.
[Production of Dielectric Layer]
As a dielectric layer configured to coat the Ag nanoparticles, a ZnO layer having a thickness of 200 nm was formed.
[Production of Electrodes]
A thin-line electrode was formed using an Ag material on the ITO layer configured as an antireflection film. Furthermore, a whole-surface electrode was formed using an Ag material on the face of the ZnO layer configured as a dielectric layer (on the principal face of the ZnO layer that is opposite to the transparent thin film).

By performing the aforementioned steps, the photoelectric conversion element (solar cell) according to Example 3-1 was produced.

EXAMPLE 3-2

A solar cell according to Example 3-2 was produced according to the same procedure as that in Example 3-1, except for the method for forming the metal nanoparticles.
[Production of Metal Nanoparticles]
An Ag thin film having a thickness of 25 nm was formed as a metal thin film on the surface of the transparent thin film using an evaporation method. The Ag thin film thus formed was heated at 200° C. so as to form multiple Ag nanoparticles on the transparent thin film.

EXAMPLE 3-3

A solar cell according to Example 3-3 was produced according to the same procedure as that in Example 3-1, except for the method for forming the metal nanoparticles.
[Production of Metal Nanoparticles]
An Ag thin film having a thickness of 30 nm was formed as a metal thin film on the surface of the transparent thin film using an evaporation method. The Ag thin film thus formed was heated at 200° C. so as to form multiple Ag nanoparticles on the transparent thin film.

COMPARISON EXAMPLE 3-1

A solar cell according to Comparison example 3-1 was produced according to the same procedure as in Example 3-1, except that the metal nanoparticles were not formed.

COMPARISON EXAMPLE 3-2

A solar cell according to Example 3-2 was produced according to the same procedure as that in Example 3-1, except for the method for forming the metal nanoparticles.
[Production of Metal Nanoparticles]
After the surface of an aluminum substrate is anodized at 80 V in a mixed aqueous solution containing 0.1 mol/L oxalic acid and 0.1 mol/L malonic acid, the aluminum substrate was removed except for the oxidized area (barrier layer). Next, a large number of holes formed in the barrier layer were etched using a 20-fold diluted phosphoric acid solution such that each hole became a through hole, thereby obtaining an alumina mask having multiple through holes. By depositing Ag on the transparent thin film through the alumina mask thus formed, multiple Ag nanoparticles having a height of 50 nm ware formed.

COMPARISON EXAMPLE 3-3

A solar cell according to Comparison example 3-3 was produced according to the same procedure as in Example 3-1, except for the method for forming the metal nanoparticles.
[Production of Metal Nanoparticles]
The transparent thin film was coated with an Ag nanoparticle dispersion liquid (containing Ag nanoparticles having an average particle diameter of 150 nm) prepared using a wet mixing method, so as to form multiple Ag nanoparticles on the transparent thin film.

ImageJ, so as to calculate the area of the individual Ag nanoparticles included in the region thus extracted. Based upon the area of each Ag nanoparticle thus obtained, the average particle area, 1% particle area ratio, 5% particle area ratio, 10% particle area ratio, and 50% particle area ratio were calculated for the Ag nanoparticles in this region. Table 4 shows the measurement results for each example and each comparison example.
[Performance Evaluation of Solar Cells]
By using artificial sunlight having an energy density of 100 mW/cm$^2$, evaluation was performed of the current-voltage characteristics of the solar cells according to Examples 3-1 through 3-3, and the solar cells according to Comparison examples 3-1 through 3-4. With the short-circuit current density obtained in Comparison example 3-1, in which Ag nanoparticles were not formed, as a reference value, the relative short-circuit current density value was calculated for each of Examples 3-1 through 3-3 and for each of Comparison examples 3-2 through 3-4. The calculation results are shown in Table 4.

TABLE 4

| | AVERAGE PARTICLE AREA(cm$^2$) | 1% PARTICLE AREA RATIO | 5% PARTICLE AREA RATIO | 10% PARTICLE AREA RATIO | 50% PARTICLE AREA RATIO | RELATIVE SHORT-CIRCUIT CURRENT DENSITY VALUE |
|---|---|---|---|---|---|---|
| EXAMPLE 1 | $3.8 \times 10^4$ | 0.02 | 0.06 | 0.15 | 1.3 | 1.032 |
| EXAMPLE 2 | $3.9 \times 10^4$ | 0.03 | 0.1 | 0.27 | 1.3 | 1.029 |
| EXAMPLE 3 | $3.9 \times 10^4$ | 0.04 | 0.15 | 0.3 | 1.2 | 1.027 |
| COMPARISON EXAMPLE 1 | — | — | — | — | — | 1 |
| COMPARISON EXAMPLE 2 | $1.1 \times 10^4$ | 0.36 | 0.49 | 0.61 | 1.1 | 0.999 |
| COMPARISON EXAMPLE 3 | $2.0 \times 10^4$ | 0.47 | 0.54 | 0.6 | 1 | 1.012 |
| COMPARISON EXAMPLE 4 | $3.2 \times 10^4$ | 0.11 | 0.26 | 0.4 | 1.2 | 1.01 |

COMPARISON EXAMPLE 3-4

A solar cell according to Comparison example 3-4 was produced according to the same procedure as in Example 3-1, except for the method for forming the metal nanoparticles.
[Production of Metal Nanoparticles]
The transparent thin film was coated with an Ag nanoparticle dispersion liquid (containing Ag nanoparticles having an average particle diameter of 200 nm) prepared using a wet mixing method, so as to form multiple Ag nanoparticles on the transparent thin film.
[Measurement of Area of Metal Nanoparticles]
Regarding the solar cells according to Examples 3-1 through 3-3 and Comparison examples 3-1 through 3-4, measurement was performed of the area of the Ag nanoparticles as viewed along a direction that is approximately orthogonal to the principal face of the photoelectric conversion layer. The measurement of the area of the Ag nanoparticles was performed by analyzing an image obtained by a scanning electron microscope (SEM). The image analysis was performed using ImageJ version 1.42q. As a method for extracting a region of the Ag nanoparticles to be measured from a SEM image, the Li method (Li, CH & Tam, PKS (1998), "An Iterative Algorithm for Minimum Cross Entropy Thresholding", Pattern Recognition Letters 18(8): 771-776) was used to extract a region having high brightness from the SEM image. The region thus extracted was subjected to particle detection processing using a particle detection function included in As shown in Table 4, it has been confirmed that, with Examples 3-1 through 3-3, the Ag nanoparticles exhibited a 1% particle area ratio that was equal to or smaller than 0.1. In contrast, with Comparison examples 3-2 through 3-4, the Ag nanoparticles exhibited a 1% particle area ratio that was greater than 0.1.

Furthermore, it has been confirmed that, with Examples 3-1 through 3-3, the Ag nanoparticles exhibited a 5% particle area ratio that is equal to or smaller than 0.2. In contrast, with Comparison examples 3-2 through 3-4, the Ag nanoparticles exhibited a 5% particle area ratio that is greater than 0.2.

Furthermore, it has been confirmed that, with Examples 3-1 through 3-3, the Ag nanoparticles exhibited a 10% particle area ratio that is equal to or smaller than 0.3. In contrast, with Comparison examples 3-2 through 3-4, the Ag nanoparticles exhibited a 10% particle area ratio that is greater than 0.3.

Furthermore, the solar cells according to Examples 3-1 through 3-3 each exhibited a marked increase in the short-circuit current density, as compared with the solar cells according to Comparison examples 3-1 through 3-4. That is to say, it has been confirmed that the solar cells according to Examples 3-1 through 3-3 had an advantage of increased light absorption. Thus, it can be readily understood that the aforementioned particle area distribution provided by Examples 3-1 through 3-3 contributes to improved performance of the solar cell.

The present invention is not restricted to each embodiment described above. Rather, various kinds of modifications may be made by changing the design or the like based upon the knowledge of those skilled in this art, which are also encompassed within the scope of the present invention.

For example, with each embodiment described above, a p-n junction is formed in the photoelectric conversion layer 20. However, the photoelectric conversion layer 20 may have a desired structure as long as it provides a photoelectric conversion function. Also, a p-i-n junction may be formed in the photoelectric conversion layer 20.

For example, with each embodiment described above, the multiple metal nanoparticles 36 are formed on the second principal face S2 side of the photoelectric conversion layer 20. Also, such multiple metal nanoparticles 36 may be formed on the first principal face S1 side of the photoelectric conversion layer 20.

The embodiments described above will be summarized below.

[Item 1]

A photoelectric conversion element comprising:
a photoelectric conversion layer; and
a plurality of metal nanoparticles arranged in the form of a two-dimensional array on the photoelectric conversion layer on its principal face side that is opposite to its light receiving face,
wherein the plurality of metal nanoparticles are arranged with a particle density that is equal to or greater than $5.0 \times 10^8/\mathrm{cm}^2$ and is equal to or smaller than $3.0 \times 10^9/\mathrm{cm}^2$.

[Item 2]

A photoelectric conversion element according to item 1, further comprising a dielectric layer having a refractive index that is equal to or greater than 1.3, and configured so as to coat a surface of each of the metal nanoparticles.

[Item 3]

A photoelectric conversion element comprising:
a photoelectric conversion layer; and
a plurality of metal nanoparticles arranged in a two-dimensional manner on the photoelectric conversion layer on its principal face side,
wherein the number of metal nanoparticles having a degree of circularity that is greater than 0 and that is equal to or smaller than 0.3, as viewed along a direction that is approximately orthogonal to the principal face of the photoelectric conversion layer, is equal to or greater than 0.3% of the total number of the plurality of metal nanoparticles.

[Item 4]

A photoelectric conversion element comprising:
a photoelectric conversion layer; and
a plurality of metal nanoparticles arranged in a two-dimensional manner on the photoelectric conversion layer on its principal face side,
wherein the number of metal nanoparticles having a degree of circularity that is greater than 0 and that is equal to or smaller than 0.4, as viewed along a direction that is approximately orthogonal to the principal face of the photoelectric conversion layer, is equal to or greater than 1% of the total number of the plurality of metal nanoparticles.

[Item 5]

A photoelectric conversion element comprising:
a photoelectric conversion layer; and
a plurality of metal nanoparticles arranged in a two-dimensional manner on the photoelectric conversion layer on its principal face side,
wherein the number of metal nanoparticles having a degree of circularity that is greater than 0 and that is equal to or smaller than 0.5, as viewed along a direction that is approximately orthogonal to the principal face of the photoelectric conversion layer, is equal to or greater than 3% of the total number of the plurality of metal nanoparticles.

[Item 6]

A photoelectric conversion element comprising:
a photoelectric conversion layer; and
a plurality of metal nanoparticles arranged in a two-dimensional manner on the photoelectric conversion layer on its principal face side,
wherein the number of metal nanoparticles having a degree of circularity that is greater than 0 and that is equal to or smaller than 0.6, as viewed along a direction that is approximately orthogonal to the principal face of the photoelectric conversion layer, is equal to or greater than 6% of the total number of the plurality of metal nanoparticles.

[Item 7]

A photoelectric conversion element comprising:
a photoelectric conversion layer; and
a plurality of metal nanoparticles arranged in a two-dimensional manner on the photoelectric conversion layer on its principal face side,
wherein the number of metal nanoparticles having a degree of circularity that is equal to or greater than 0.3 and that is equal to or smaller than 0.4, as viewed along a direction that is approximately orthogonal to the principal face of the photoelectric conversion layer, is equal to or greater than 1% of the total number of the plurality of metal nanoparticles.

[Item 8]

A photoelectric conversion element comprising:
a photoelectric conversion layer; and
a plurality of metal nanoparticles arranged in a two-dimensional manner on the photoelectric conversion layer on its principal face side,
wherein the number of metal nanoparticles having a degree of circularity that is equal to or greater than 0.4 and that is equal to or smaller than 0.5, as viewed along a direction that is approximately orthogonal to the principal face of the photoelectric conversion layer, is equal to or greater than 3% of the total number of the plurality of metal nanoparticles.

[Item 9]

A photoelectric conversion element comprising:
a photoelectric conversion layer; and
a plurality of metal nanoparticles arranged in a two-dimensional manner on the photoelectric conversion layer on its principal face side,
wherein the number of metal nanoparticles having a degree of circularity that is equal to or greater than 0.5 and that is equal to or smaller than 0.6, as viewed along a direction that is approximately orthogonal to the principal face of the photoelectric conversion layer, is equal to or greater than 4% of the total number of the plurality of metal nanoparticles.

[Item 10]

A photoelectric conversion element comprising:
a photoelectric conversion layer; and
a plurality of metal nanoparticles arranged in a two-dimensional manner on the photoelectric conversion layer on its principal face side,
wherein, as viewed along a direction that is approximately orthogonal to the principal face of the photoelectric conversion layer, the plurality of metal nanoparticles are configured to have an average degree of circularity that is equal to or smaller than 0.8.

[Item 11]

A photoelectric conversion element comprising:
a photoelectric conversion layer; and
a plurality of metal nanoparticles arranged in a two-dimensional manner on the photoelectric conversion layer on its principal face side,

[Item 17]

A photoelectric conversion element according to any one of Items 3 through 16, wherein the plurality of metal nanoparticles are formed by heating a metal thin film.

[Item 18]

A photoelectric conversion element according to any one of Items 1 through 17, wherein the plurality of metal nanoparticles are formed of Au, Ag, Al, or Cu, or otherwise an alloy material containing such metal materials.

[Item 19]

A photoelectric conversion element according to any one of Items 1 through 18, further comprising a transparent thin film provided between the plurality of metal nanoparticles and the photoelectric conversion layer.

[Item 20]

A photoelectric conversion element according to Item 19, wherein the transparent thin film is configured to have an oxygen content of 5 atm % or more.

wherein, as viewed along a direction that is approximately orthogonal to the principal face of the photoelectric conversion layer, the plurality of metal nanoparticles are configured to have a 10% degree of circularity that is equal to or smaller than 0.6.

[Item 12]

A photoelectric conversion element comprising:

a photoelectric conversion layer; and a plurality of metal nanoparticles arranged in a two-dimensional manner on the photoelectric conversion layer on its principal face side, wherein, as viewed along a direction that is approximately orthogonal to the principal face of the photoelectric conversion layer, the plurality of metal nanoparticles are configured to have a 1% particle area ratio that is equal to or smaller than 0.1.

[Item 13]

A photoelectric conversion element comprising:

a photoelectric conversion layer; and a plurality of metal nanoparticles arranged in a two-dimensional manner on the photoelectric conversion layer on its principal face side, wherein, as viewed along a direction that is approximately orthogonal to the principal face of the photoelectric conversion layer, the plurality of metal nanoparticles are configured to have a 5% particle area ratio that is equal to or smaller than 0.2.

[Item 14]

A photoelectric conversion element comprising:

a photoelectric conversion layer; and a plurality of metal nanoparticles arranged in a two-dimensional manner on the photoelectric conversion layer on its principal face side, wherein, as viewed along a direction that is approximately orthogonal to the principal face of the photoelectric conversion layer, the plurality of metal nanoparticles are configured to have a 10% particle area ratio that is equal to or smaller than 0.3.

[Item 15]

A photoelectric conversion element according to any one of Items 3 through 14, wherein the plurality of metal nanoparticles are arranged on the photoelectric conversion layer on its principal face side that is opposite to its light receiving face.

[Item 16]

A photoelectric conversion element according to any one of Items 1 through 15, wherein the photoelectric conversion layer is configured as a monocrystalline silicon layer having a pn junction or otherwise a polysilicon layer having a pn junction.

What is claimed is:

1. A photoelectric conversion element comprising:

a photoelectric conversion layer; and a plurality of metal nanoparticles arranged in the form of a two-dimensional array on the photoelectric conversion layer on its principal face side that is opposite to its light receiving face, wherein the plurality of metal nanoparticles are arranged with a particle density that is equal to or greater than $5.0 \times 10^8/cm^2$ and is equal to or smaller than $3.0 \times 10^9/cm^2$.

2. A photoelectric conversion element according to claim 1, further comprising a dielectric layer having a refractive index that is equal to or greater than 1.3, and configured so as to coat a surface of each of the metal nanoparticles.

3. A photoelectric conversion element according to claim 1, wherein the photoelectric conversion layer is configured as a monocrystalline silicon layer having a pn junction or otherwise a polysilicon layer having a pn junction.

4. A photoelectric conversion element according to claim 1, wherein the plurality of metal nanoparticles are formed of Au, Ag, Al, or Cu, or otherwise an alloy material containing such metal materials.

5. A photoelectric conversion element according to claim 1, further comprising a transparent thin film provided between the plurality of metal nanoparticles and the photoelectric conversion layer.

6. A photoelectric conversion element according to claim 5, wherein the transparent thin film is configured to have an oxygen content of 5 atm % or more.

* * * * *